United States Patent
Maruo et al.

(10) Patent No.: US 11,624,765 B2
(45) Date of Patent: Apr. 11, 2023

(54) TEST DEVICE AND A TEST METHOD

(71) Applicant: ANRITSU CORPORATION, Atsugi (JP)

(72) Inventors: Tomohiko Maruo, Atsugi (JP); Hiroyuki Baba, Atsugi (JP); Masafumi Setsu, Atsugi (JP)

(73) Assignee: ANRITSU CORPORATION, Atsugi (JP)

( * ) Notice: Subject to any disclaimer, the term of this patent is extended or adjusted under 35 U.S.C. 154(b) by 226 days.

(21) Appl. No.: 17/159,712

(22) Filed: Jan. 27, 2021

(65) Prior Publication Data
US 2021/0247431 A1 Aug. 12, 2021

(30) Foreign Application Priority Data

Feb. 6, 2020 (JP) .............................. JP2020-019003
Feb. 6, 2020 (JP) .............................. JP2020-019004

(51) Int. Cl.
G01R 29/10 (2006.01)
G01R 29/08 (2006.01)
H04B 17/00 (2015.01)
H01Q 3/16 (2006.01)

(52) U.S. Cl.
CPC ..... *G01R 29/0871* (2013.01); *G01R 29/0821* (2013.01); *H01Q 3/16* (2013.01); *H04B 17/0085* (2013.01)

(58) Field of Classification Search
CPC .. G01R 29/0871; G01R 29/0821; H01Q 3/16; H04B 17/0085; H04B 17/102; H04B 17/15; H04B 17/00; H04B 17/29
USPC .......................................... 455/423; 375/224
See application file for complete search history.

(56) References Cited

U.S. PATENT DOCUMENTS

| 10,044,104 | B1* | 8/2018 | Bartko ..................... H01Q 3/08 |
| 2019/0288748 | A1* | 9/2019 | Rowell ................ H04B 17/103 |
| 2019/0302184 | A1 | 10/2019 | Rowell et al. |
| 2020/0217885 | A1* | 7/2020 | Rowell ............. G01R 31/3025 |

(Continued)

FOREIGN PATENT DOCUMENTS

| JP | 2003057281 A | 2/2003 |
| JP | 2018223942 A | 11/2018 |

OTHER PUBLICATIONS

3GPP TR 38.810 V16.2.0 (Mar. 2019); Partially referred to in the specification of the present application to describe an example of an OTA test using a quiet zone in which the DTU is arranged, (see para. [0004] and [0005]).

*Primary Examiner* — Don N Vo
(74) *Attorney, Agent, or Firm* — Greer Burns & Crain Ltd.

(57) ABSTRACT

A test device 1 that measures the transmission properties or reception properties of the test object 100 having the test antenna 110, and includes an anechoic box 50, a plurality of test antennas 6 that transmit or receive radio signals to or from the antenna, under tests, a posture changeable mechanism 56 that changes the posture of the test object arranged in the quiet zone QZ, a measurement device 2 that measures the transmission properties or reception properties of the test object with respect to the test object whose posture is changed by the posture changeable mechanism using the test antenna, and the reflector 7 that radio signal is reflected. The plurality of test antennas include a reflection type test antenna 6a and the plurality of direct-type test antennas 6b, 6c, 6d.

13 Claims, 18 Drawing Sheets

(56) References Cited

U.S. PATENT DOCUMENTS

2020/0264223 A1* 8/2020 Pabst ................. G01R 29/0821
2021/0341528 A1* 11/2021 Sanchez Hernandez ....................
                                                    H01Q 13/0208
2022/0018884 A1* 1/2022 Hong ................... H04B 17/102

* cited by examiner

TEST DEVICE AND A TEST METHOD

CROSS-REFERENCE TO RELATED APPLICATIONS

This application claims Convention priority to Japanese Patent Application No. 2020-019003, filed Feb. 6, 2020, and Japanese Patent Application No. 2020-019004, filed Feb. 6, 2020, the entire contents of which are incorporated herein by reference.

FIELD OF THE INVENTION

The present invention relates to a test device and a test method for measuring transmission properties or reception properties of a device under test by using an anechoic box in an OTA (Over The Air) environment.

In recent years, with the development of multimedia, wireless terminals (smartphones, and the like.) provided with antennas for wireless communication such as cellular and wireless LAN have been actively produced. In the future, in particular, there is a demand for wireless terminals that transmit and receive wireless signals compatible with IEEE802.11ad, 5G cellular, etc., which use wideband signals in the millimeter wave band.

A wireless terminal design/development company or its manufacturing plant performs a performance test to determine whether these RFs (Radio Frequency) properties meet a predetermined standard, by measuring the output level and reception sensitivity of transmitted radio waves specified for each communication standard for the wireless communication antenna provided in the wireless terminal. In the performance test, RRM (Radio Resource Management) properties are also measured. The measurement of the RRM properties is performed in order to confirm whether or not the radio resource control between the base station and the wireless terminal, for example, the handover between the adjacent base stations, and the like operates correctly.

With the generation shift from 4G or 4G advance to 5G, the test method of the above-mentioned performance test is also changing. For example, in a performance test in which a wireless terminal for a 5G NR system (New Radio System) (hereinafter referred to as a 5G wireless terminal) is the subject of a test (Device Under Test: DUT), the method of connecting the antenna terminal of the DUT and the test device by wire, which is a mainstream in the tests of 4G, 4G advance, and the like cannot be used because it is not realistic in consideration of the deterioration of the properties due to the attachment of the antenna terminal to the high frequency circuit or space and cost due to the large number of array antenna elements and attaching antenna terminals to all elements. For this reason, the DUT is housed together with the test antenna in an anechoic box that is not affected by the surrounding radio wave environment, and the test signal is transmitted from the test antenna to the DUT and the test signal from the DUT that receives the test signal is tested. A so-called OTA test is performed in which reception by an antenna is performed by wireless communication (see, for example, Patent Document 1 and Patent Document 2).

In the OTA test, a quiet zone is formed by the test antenna, and the DUT is placed in the quiet zone. Here, the quiet zone is a concept that represents the range of the spatial region in which the DUT is irradiated with radio waves having substantially uniform amplitude and phase from the test antenna in the radio wave anechoic box constituting the OTA test environment (the quiet zone). For example, see Non-Patent Document 1. The shape of the quiet zone is usually spherical. By arranging the DUT in such a quiet zone, it becomes possible to perform the OTA test in a state where the influence of scattered waves from the surroundings is suppressed.

CITATION LIST

Patent Literature

[Patent Document 1] Japanese Patent Application No. 2018-223942
[Patent Document 2] US Patent Application Publication No. US2019/0302184

Non-Patent Literature

[Non-Patent Document 1] 3GPP TR 38.810 V16.2.0 (2019-03)

SUMMARY OF THE INVENTION

Technical Problem

In the test device described in Patent Document 2, a plurality of test antennas capable of transmitting and receiving to and from the DUT's test antenna are provided in the anechoic box, and the RF properties and RRM properties of the DUT are measured. In the measurement of RF properties and RRM properties, far field measurement (FFM (Far Field Measurement)) is generally used. Each of the test antennas of Patent Document 2 is provided with a reflector so that the radio wave radiated from the test antenna is reflected toward the DUT or the radio wave radiated from the DUT is reflected toward the test antenna. However, in the test device described in Patent Document 2, since each test antenna is provided with a reflector, the structure is complicated and a large installation area for installing an anechoic box is required. In addition, a mechanism for moving the test antenna is required, and the configuration of the signal processing unit connected to the plurality of test antennas is complicated, resulting in high cost.

The present invention has been made to solve such a conventional problem, and it is an object of the present invention to provide a test device and a test method capable of performing far field measurement of transmission/reception properties such as RF properties and RRM properties at low cost.

Means to Solve the Problem

In order to solve the above problems, the test device according to the present invention is a test device (1) to measure transmission properties or reception properties of a test object (100) having an antenna under test (110), the test device comprising: an anechoic box (50) having an internal space (51) that is not affected by a radio environment; a plurality of test antennas (6), accommodated in the internal space, to transmit or receive a radio signal to or from the antenna under test; a posture changeable mechanism (56) to change a posture of the test object arranged in a quiet zone (QZ) in the internal space; a measurement device (2) to measure the transmission properties or the reception properties of the test object, using the test antenna with respect to the test object whose posture is changed by the posture changeable mechanism; and a reflector (7) on which the radio signal is reflected, wherein the plurality of test antennas include a reflection-type test antenna (6a) that transmits or receives the radio signal to or from the antenna under test through the reflector (7), and a plurality of direct-type test antennas (6b, 6c, 6d) that directly transmits or receives the radio signal to or from the antenna under test.

By this configuration, in the test device according to the present invention, the plurality of test antennas have a hybrid configuration including a reflection-type test antenna that indirectly transmits/receives radio signals using a reflector, and a plurality of direct-type test antenna that directly transmits/receives radio signals. This configuration makes it possible to use a wider quiet zone in the case that the reflection-type test antenna, capable of forming a relatively wider quiet zone compared with the direct-type test antenna, is used alone, while minimizing the number of reflection-type test antennas with complex structure. In addition, the direct-type test antenna does not use a reflector, which saves installation space. Therefore, the test device according to the present invention can perform far field measurement of transmission/reception properties such as RF properties and RRM properties of the test object at low cost.

Further, in the test device according to the present invention, the plurality of direct-type test antennas are arranged on the same plane passing through an arrangement position ($P_{DUT}$) of the test object, and form predetermined arrival angles differing from each other with respect to a radio wave arrival direction from the reflection-type test antenna at the arrangement position of the test object. And, at least one of the plurality of direct-type test antennas form an additional arrival angle different from the predetermined arrival angles with respect to a radio wave arrival direction from either one of other the direct-type test antennas at the arrangement position of the test object.

As described above, the direct-type test antennas have different predetermined arrival angles (AoA (Angle of Arrival)) with respect to the radio wave arrival direction from the reflection-type test antenna at the arrangement position of the test object. And, at least one of the plurality of direct-type test antennas form an additional arrival angle different from the predetermined arrival angles with respect to the radio wave arrival angle from either one of other the direct-type test antennas at the arrangement position of the test object. By this configuration, the number of test antennas required can be reduced. As a result, cost reduction and space saving can be realized. Moreover, since the direct-type test antennas are arranged on the same plane passing through the arrangement position of the test object, the positioning work at the time of installation is easy. Therefore, the test device according to the present invention can provide a test device and a test method capable of performing far field measurement of transmission/reception properties such as RF properties and RRM properties of the test object at low cost with a small umber of antennas.

Further, in the test device according to the present invention, the plurality of direct-type test antennas may be arranged on a plane (IP) inclined with respect to a horizontal plane.

By this configuration, the direct-type test antennas are arranged on a plane inclined with respect to the horizontal plane, so that even an anechoic box with a small internal space can secure a distance between the test antenna and the antenna under test (or the test object) required for far field measurement.

Further, in the test device according to the present invention, the anechoic box may be so configured to have a shape of a substantially rectangular parallelepiped or a substantially cube, and the inclined plane intersects with a boundary between one side plate and a top plate or a boundary between the one side plate and a bottom plate of the anechoic box.

By this configuration, the test device according to the present invention can minimize the internal space of the anechoic box, while maintaining the distance between the test antenna and the antenna under test (or the test object) required to realize field measurement.

Further, in the test device according to the present invention, the plurality of direct-type test antennas may be configured to include: a direct-type first test antenna (6b) that forms an arrival angle of a predetermined angle (θ) in one rotation direction with respect to the radio wave arrival direction from the reflection-type test antenna at the arrangement position of the test object, a direct-type second test antenna (6c) that forms an arrival angle of two times the predetermined angle (θ) in other rotation direction opposite to the one rotation direction with respect to the radio wave arrival direction at the arrangement position of the test object, and a direct-type third test antenna (6d) that forms an arrival angle of four times the predetermined angle (θ) in the other rotation direction with respect to the radio wave arrival direction at the arrangement position of the test object.

By this configuration, the test device according to the present invention can form a relative arrival angle of 3θ by the direct-type first test antenna and the direct-type second test antenna, and a relative arrival angle of 5θ by the direct-type first test antenna and the direct-type third test antenna. As a result, the direct-type first, second, and third test antennas can realize relative arrival angles θ, 2θ, 3θ, 4θ, and 5θ together with the reflection-type test antenna. Therefore, the number of antennas can be reduced from the configuration in which a total of 6 test antennas are used to obtain 5 relative arrival angles (see FIG. 1).

Further, in the test device according to the present invention, the predetermined arrival angle and the additional arrival angle may be multiples of a specific angle.

By this configuration, the test device according to the present invention can measure the RRM properties evenly and without leakage within a predetermined angle range, so that the RRM properties can be measured accurately.

Further, in the test device according to the present invention, the predetermined arrival angle and the additional arrival angle may include 30°, 60°, 90°, 120°, and 150°.

By this configuration, the test device according to the present invention can measure the RRM properties specified in the standard 3GPP TR 38.810 V16.2.0 (2019-03). Further, since the specific angle θ is 30°, with respect to the radio wave arrival direction (Z axis) from the reflection-type test antenna, the first test antenna forms an arrival angle of 30°, the second test antenna forms an arrival angle of 60°, and the third test antenna forms an arrival angle of 120°, and there is no test antenna forming an arrival angle of 90°. Therefore, the internal space of the anechoic box can be reduced while maintaining the distance between the test antenna and the test antenna (or the test target) required to realize the far field measurement.

Further, in the test device according to the present invention, the plurality of direct-type test antennas may be arranged at least $2D^2/\lambda$ away from the antenna under test, where D is an antenna size of the test under test, $\lambda$ is the wavelength of the radio wave transmitted from the plurality of direct-type test antennas.

By this configuration, the test device according to the present invention can make a far field measurement of the test object in the anechoic box having a small internal space, since a plurality of direct-type test antennas are arranged at least $2D^2/\lambda$ away from the antenna under test.

Further, in the test device according to the present invention, the plurality of direct-type test antennas may be arranged outside a path of the radio wave beam passing through the quiet zone by reflecting the reflector of the reflection-type test antenna.

By this configuration, the test device according to the present invention can form a good quiet zone.

Further, in the test device according to the present invention, the measurement device includes: a signal processing unit (40) that converts a frequency of a signal transmitted as a radio wave by the plurality of the test antenna or a frequency of a radio signal received by the plurality of test antennas; and a switching unit (141) that switches a signal path between the signal processing unit and the plurality of direct-type test antenna to a signal path that one test antenna of the plurality of direct-type test antennas and the signal processing unit are connected.

As described above, the measuring device is provided with a switching unit that switches a signal path between the signal processing unit and the plurality of direct-type test antenna to a signal path that one test antenna of the plurality of direct-type test antennas and the signal processing unit are connected. By this configuration, the number of signal processing units is significantly reduced as compared with the conventional test device in which signal processing units are provided for each of the plurality of test antennas, so that cost reduction and space saving can be realized. Therefore, the test device according to the present invention can perform far field measurement of transmission/reception properties such as RF properties and RRM properties of the test object at low cost.

Further, the test device according to the present invention may be so configured that, the signal processing unit includes a first frequency conversion unit (144) that converts a frequency of a signal to be transmitted as a radio signal by the reflection-type test antenna or a frequency of a radio signal received by the reflection-type test antenna, and a second frequency conversion unit (145) that converts a frequency of a signal to be transmitted as a radio signal by the direct-type one test antenna switched by the switching unit or a frequency of a radio signal received by the direct-type one test antenna.

By this configuration, the test device according to the present invention is provided with a first frequency conversion unit for the reflection-type test antenna and a second frequency conversion unit for the direct-type one test antenna, so that it is possible to measure the RRM properties and the like by using the reflection-type test antenna and the direct-type one test antenna.

Further, the test device according to the present invention may be so configured that the first frequency conversion unit includes a first transmission converter (146) that up-converts a signal to be transmitted as a radio signal from the reflection-type test antenna, and a first reception converter (147) that down-converts a radio signal received by the reflection-type test antenna, the second frequency conversion unit includes a second transmission converter (148) that up-converts a signal to be transmitted as a radio signal from the plurality of the direct-type test antennas and a second reception converter (149) that down-converts a radio signal received by the plurality of the direct-type test antennas, the first transmission converter includes a first up-converter (150) that up-converts a signal to be transmitted as a horizontally polarized radio signal from the reflection-type test antenna and a second up-converter (151) that up-converts a signal to be transmitted as a vertically polarized radio signal from the reflection-type test antenna, the first reception converter includes a first down converter (154) that down-converts a horizontally polarized radio signal received by the reflection-type test antenna and a second down-converter (155) that down-converts a vertically polarized radio wave received from the reflection-type test antenna, the second transmission converter includes a third up-converter (152) that up-converts a signal to be transmitted as a horizontally polarized radio signal from the plurality of the direct-type test antennas and a fourth up-converter (153) that up-converts a signal to be transmitted as a vertically polarized radio signal from the plurality of the direct-type test antennas, the second reception converter includes a third down-converter (156) that down-converts a horizontally polarized radio signal received by the plurality of direct-type test antennas and a fourth down-converter (157) that down-converts a vertically polarized radio signal received by the plurality of direct-type test antennas.

By this configuration, the test device according to the present invention can use the test antenna for both transmission and reception, so that the transmission properties and reception properties of the test object can be measured. In addition, the transmission/reception properties such as the RRM properties of the test object can be measured using the horizontally polarized signals and the vertically polarized signals.

Further, the test device according to the present invention may be so configured that the plurality of direct-type test antennas form mutually different arrival angles with respect to an arrival direction of a radio waves from the reflection-type test antenna at the arrangement position ($P_{DUT}$) of the test object.

By this configuration, the test device according to the present invention has a different arrival angle depending on the combination of the reflection-type test antenna and the direct-type test antenna, so that far field measurement of transmission/reception properties such as RRM properties of the test device can be efficiently performed by changing the arrival angle through switching the direct-type test antenna.

Further, the test method according to the present invention is a test method to use a test device (1) to measure transmission properties or reception properties of a test object (100) having an antenna under test (110), the test device comprising: an anechoic box (50) having an internal space (51) that is not affected by a radio environment; a plurality of test antennas (6), accommodated in the internal space, to transmit or receive a radio signal to or from the antenna, under test; a posture changeable mechanism (56) to change a posture of the test object arranged in a quiet zone (QZ) in the internal space; and a measurement device (2) to measure the transmission properties or the reception properties of the test object, using the test antenna with respect to the test object whose posture is changed by the posture changeable mechanism, wherein the plurality of test antennas include a reflection-type test antenna (6a) that transmits or receives the radio signal to or from the antenna under test through a reflector (7), and a plurality of direct-type test antennas (6b, 6c, 6d) that directly transmits or receives the radio signal to or from the antenna under test, the test method including a step to change the posture of the test object arranged in the quite zone by the posture changeable mechanism, and a measurement step to measure the transmission properties or the reception properties of the test object by using the test antennas by the measurement device with respect to the test object whose posture has been changed by the posture changeable mechanism.

By this configuration, in the test device used in the test method according to the present invention, the plurality of test antennas have a hybrid configuration including a reflection-type test antenna that transmits and receives radio signals indirectly through the reflector and the plurality of direct-type test antennas that directly transmits and receives radio signals. This minimizes the number of reflection-type test antennas with complex structures, while a wider quiet zone can be used when using a single reflection-type test antenna that can form a relatively wider quiet zone than direct test antennas. In addition, an installation space can be saved, since the direct test antenna does not use a reflector. Therefore, the test method according to the present invention can perform far field measurement of transmission/reception properties such as RF properties and RRM properties of the test object at low cost.

Further, the test method according to the present invention may be so configured that it further includes a step to select a test antenna to be used from among the plurality of test antennas, and that the measurement step measures transmission properties and reception properties of the test object, using the selected test antenna.

By this configuration, the test method according to the present invention performs a measurement by selecting an appropriate test antenna from among the plurality of test antennas, so that far field measurement of transmission/reception properties such as RF properties and RRM properties can be performed effectively at low cost.

Further, the test method according to the present invention may be so configured that the measurement device further includes: a signal processing unit (40) that converts a frequency of a signal transmitted as a radio wave by the plurality of the test antennas or a frequency of a radio signal received by the plurality of test antennas; and a switching unit (141) that switches a signal path between the signal processing unit and the plurality of direct-type test antennas to a signal path that one test antenna of the plurality of direct-type test antennas and the signal processing unit are connected, and that the test method further includes a step to switch to the signal path that one test antenna of the plurality of direct-type test antennas and the signal processing unit are connected by the switching unit, and the measurement step measures the transmission properties or the reception properties of the test object, using the reflection-type test antenna and the switched direct-type test antenna.

As described above, the test device used in the test method according to the present invention switches to the signal path that one test antenna of the plurality of direct-type test antennas and the signal processing unit are connected by the switching unit, so that it is possible to perform the test at lower cost, compared to the case which uses conventional test devices that are provided with signal processing units respectively for the plurality of test antennas. Therefore, the test method according to the present invention can perform far field measurement of transmission/reception properties such as RF properties and RRM properties of the test object at low cost.

Effect of the Invention

According to the present invention, it is possible to provide a test device capable of performing far field measurement of transmission/reception properties such as RF properties and RRM properties of a test object at low cost, and a test method using the same.

DETAILED DESCRIPTION OF EMBODIMENTS

Figure 1:
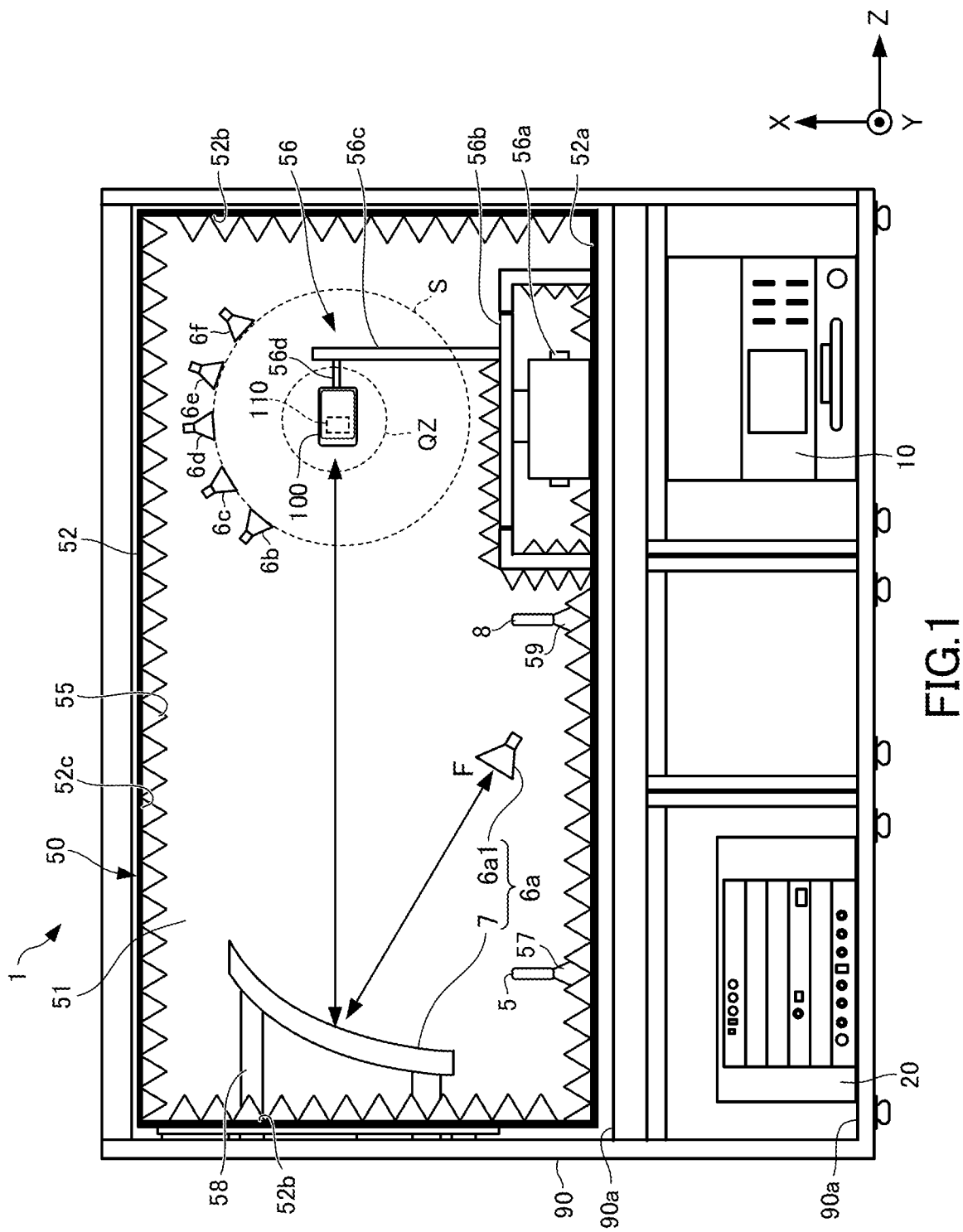
FIG. 1 is a diagram showing a schematic configuration of the entire test device according to the first embodiment of the present invention.

Hereinafter, the test device and test method according to the embodiment of the present invention will be described with reference to the drawings. The dimensional ratio of each component on each drawing does not always match the actual dimensional ratio.

The test device 1 according to the present embodiment measures the transmission properties or the reception properties of the DUT 100 having an antenna 110, for example, the RF properties and the RRM properties of the DUT 100 are measured. For this purpose, the test device 1 includes an OTA chamber 50, a plurality of test antennas 6a, 6b, 6c, 6d, 6e, 6f (hereinafter, may be referred to as a test antenna 6), and a posture changeable mechanism 56, an integrated control device 10, an NR system simulator 20, a signal processing unit 40, and a signal switching unit 140. The OTA chamber 50 of the present embodiment corresponds to the anechoic box of the present invention, and the integrated control device 10, the NR system simulator 20, the signal processing unit 40, and the signal switching unit 140 of the present invention correspond to the measuring device 2 of the present invention.

Figure 2:
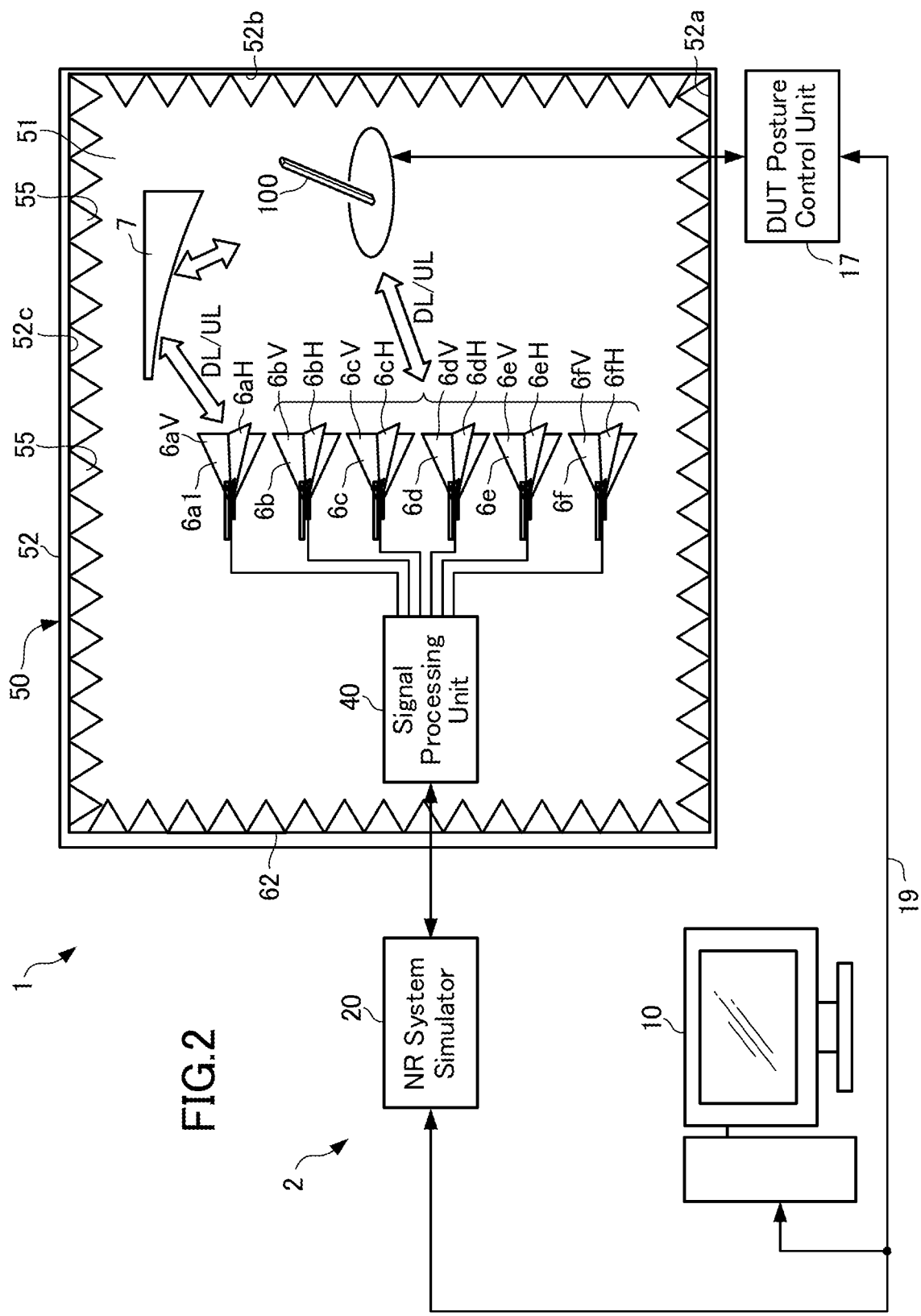
FIG. 2 is a block diagram showing a functional configuration of a test device according to the first embodiment of the present invention.

FIG. 1 shows an external structure of the test device 1, and FIG. 2 shows a functional block of the test device 1. However, FIG. 1 shows an arrangement mode of each component of the OTA chamber 50 in a state of being seen through from the front.

As shown in FIGS. 1 and 2, the OTA chamber 50 has an internal space 51 that is not affected by the surrounding radio wave environment. The test antenna 6 is accommodated in the internal space 51 of the OTA chamber 50, and transmits or receives a radio signal for measuring the transmission properties or the reception properties of the DUT 100 to or from the antenna 110. The posture changeable mechanism 56 changes the posture of the DUT 100 arranged in a quiet zone QZ in the internal space 51 of the OTA chamber 50. The integrated control device 10, the NR system simulator 20, the signal processing unit 40, and the signal switching unit 140 are configured to measure transmission properties or reception properties of the DUT 100, using 1 or 2 of the test antennas 6 with respect to the DUT 100 whose posture is changed by the posture changeable mechanism 56.

The test device 1 is used together with a rack structure 90 having a plurality of racks 90a as shown in FIG. 1, and is operated in a manner in which each component is placed on each rack 90a. FIG. 1 shows an example in which the integrated control device 10, the NR system simulator 20, and the OTA chamber 50 are mounted on each rack 90a of the rack structure 90, respectively. Hereinafter, each component will be described.

(OTA Chamber)

The OTA chamber 50 realizes an OTA test environment for a performance test of a wireless terminal for 5G, and as shown in FIGS. 1 and 2, for example, is constituted by a metal housing body 52 having a rectangular parallelepiped internal space 51. The OTA chamber 50 accommodates the DUT 100 and a plurality of test antennas 6 facing the antenna 110 of the DLIT 100 in the internal space 51 in a state of preventing the intrusion of radio waves from the outside and the radiation of radio waves to the outside. As will be described later, for example, a reflection-type antenna using a reflector or an antenna for millimeter waves having directivity such as a horn antenna can be used as the test antenna 6.

Further, a radio wave absorber 55 is attached to an entire inner surface of the OTA chamber 50, that is, the entire surface of the bottom surface 52a, the side surface 52b and the top surface 52c of the housing body 52, so that the function of restricting the radiation of radio waves to the outside is strengthened. Thus, the OTA chamber 50 realizes an anechoic box having the internal space 51 that is not affected by the surrounding radio wave environment. The anechoic box used in this embodiment is, for example, an anechoic type.

(DUT)

The DUT 100, which constitutes the test object, is a wireless terminal such as a smartphone. Communication standards for DUT 100 include cellular (LTE, LTE-A, W-CDMA (registered trademark), GSM (registered trademark), CDMA2000, 1×EV-DO, TD-SCDMA, and the like), wireless LAN (IEEE802.11b/g/g/(A/n/ac/ad, and the like), Bluetooth (registered trademark), GNSS (GPS, Galileo, CDMA, BeiDou, and the like), FM, and digital broadcasting (DVB-H, ISDB-T, and the like). Further, the DUT 100 may be a wireless terminal that transmits/receives a radio signal in a millimeter wave band corresponding to 5G cellular or the like.

In the present embodiment, the DUT 100 is constituted by a 5G NR wireless terminal. For 5G NR wireless terminals, the 5G NR standard stipulates that the communicable frequency range is a predetermined frequency band that includes not only the millimeter wave band, but also other frequency bands used in LTE and the like. Therefore, the antenna 110 of the DUT 100 transmits or receives a radio signal of a predetermined frequency band (5G NR band) for measuring the transmission properties or the reception properties of the DUT 100. The antenna 110 is, for example, an array antenna such as a Massive-MIMO antenna, and corresponds to the antenna under test in the present invention.

In the present embodiment, the DUT 100 can transmit and receive a test signal and a signal to be measured through one or two test antennas selected from among a plurality of test antennas 6 during measurement regarding transmission and reception in the OTA chamber 50.

(Posture Changeable Mechanism)

Next, the posture changeable mechanism 56 provided in the internal space 51 of the OTA chamber 50 will be described. As shown in FIG. 1, the posture changeable mechanism 56 that changes the posture of the DUT 100 arranged in the quiet zone QZ is provided on the bottom surface 52a on the side of the internal space 51 of the housing body 52 of the OTA chamber 50. The posture changeable mechanism 56 is, for example, a biaxial positioner including a rotating mechanism that rotates around each of the biaxial axes. The posture changeable mechanism 56 constitutes an OTA test system (Combined-axes system) in which the DUT 100 is rotated with a degree of freedom of rotation around two axes while the test antenna 6 is fixed. Specifically, the posture changeable mechanism 56 includes a drive unit 56a, a turntable 56b, a support column 56c, and a DUT mounting unit 56d which constitutes a test object mounting unit.

The drive unit 56a is constituted by a drive motor such as a stepping motor that generates a rotational driving force, and is installed on, for example, a bottom surface 52a. The turntable 56b is adapted to rotate by a predetermined angle around one of the two axes orthogonal to each other by the rotational driving force of the driving unit 56a. The support column 56c is connected to the turntable 56b, extends from the turntable 56b in the direction of one axis, and rotates together with the turntable 56b by the rotational driving force of the drive unit 56a. The DUT mounting unit 56d extends from the side surface of the support column 56c in the direction of the other axis of the two axes, and is rotated by a predetermined angle around the other axis by the rotational driving force of the driving unit 56a. The DUT 100 is mounted on the DUT mounting unit 56d.

Note that one of the above axes is, for example, an axis extending in the vertical direction with respect to the bottom surface 52a (x-axis in the figure). The other axis is, for example, a shaft extending in the horizontal direction from the side surface of the support column 56c. The posture changeable mechanism 56 thus configured can rotate the DUT 100 held in the DUT mounting unit 56d, for example with the center of the DUT 100 as the center of rotation (also referred to as "arrangement position"), so that the antenna 110 points in all directions in three dimensions. This means that the test device 1 of the present embodiment can perform a test by a "Black-box approach" by the posture changeable mechanism 56 as described above. Alternatively, the posture changeable mechanism 56 may sequentially change the posture of the DUT 100 so that the antenna 110 faces in all three-dimensional directions with the center of the antenna 110 as the center of rotation.

In the OTA test system, the center of the DUT 100 or the center of the antenna 110 is arranged at the center of rotation (also referred to as the origin), which is the intersection of the two rotation axes of the posture changeable mechanism 56. The "arrangement position $P_{DUT}$" of the DUT 100 is the origin of the OTA test system, and is the center of the DUT 100 or the center of the antenna 110 arranged in the OTA chamber 50. This means that the arrangement position $P_{DUT}$ of the DUT 100 corresponds to the immovable center of rotation when the DUT 100 is rotated about two axes by the posture changeable mechanism 56. In a case where the position and antenna size of the antenna 110 in the DUT 100 are known, when the arrangement position $P_{DUT}$ of the DUT 100 is set to the center position of the antenna 110, it is possible to significantly reduce the distance from the test antenna 6 to the antenna 110 required to form a far field.

(Link Antennas)

In the OTA chamber 50, two types of link antennas 5 and 8 for establishing or maintaining a link (call) with the DUT 100 are attached at required positions of the housing body 52 by using holders 57 and 59, respectively. The link antenna 5 is a link antenna for LTE, and is used in a non-standalone mode. On the other hand, the link antenna 8 is a link antenna for 5G and is used in a stand-alone mode. The link antennas 5 and 8 are held by the holders 57 and 59, respectively, so as to have directivity with respect to the DUT 100 held by the posture changeable mechanism 56. Since it is possible to use the test antenna 6 as a link antenna instead of using the above link antennas 5 and 8, the test antenna 6 will be described below assuming that the test antenna 6 also functions as a link antenna.

(Near Field and Far Field)

Figure 5A:
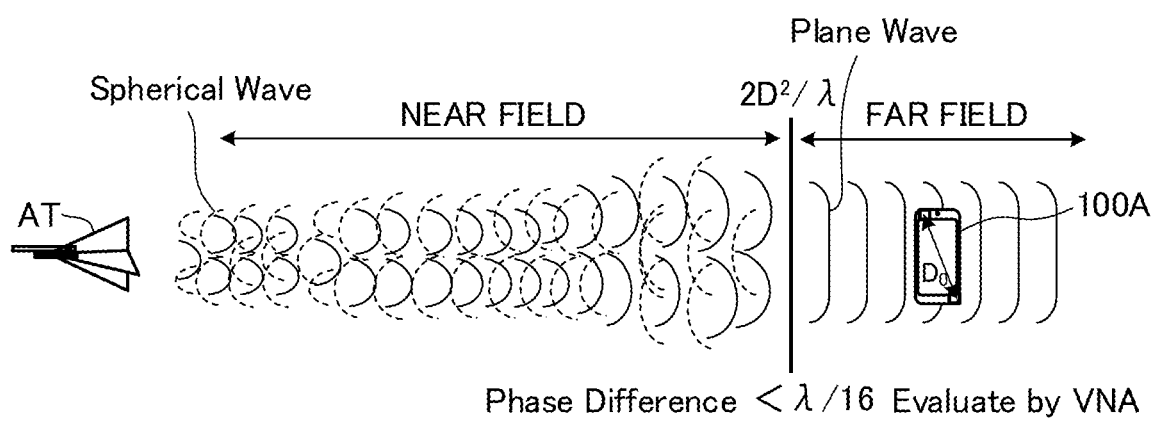
FIG. 5A is a schematic diagram for explaining a near field and a far field in radio wave propagation between the antenna AT and a wireless terminal.
Figure 5B:
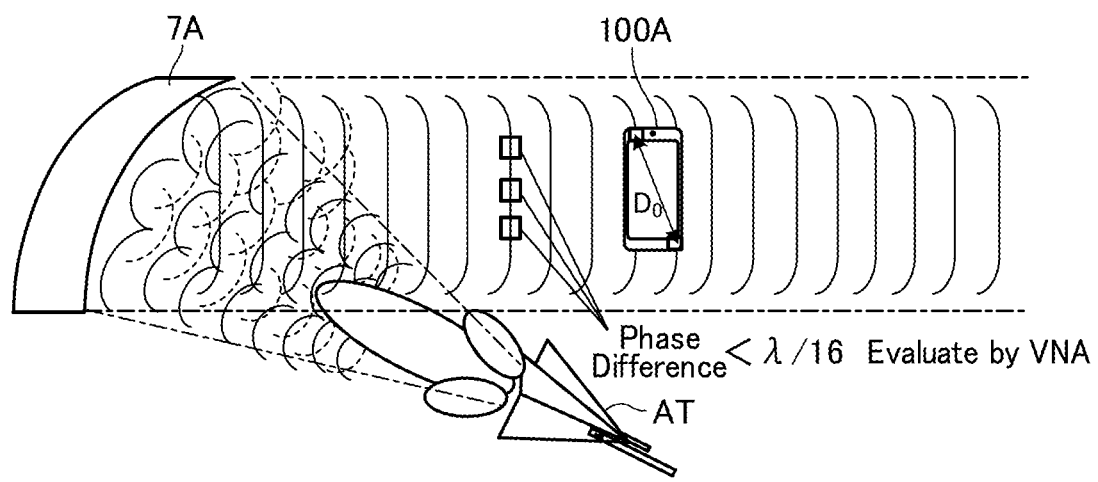
FIG. 5B is a schematic diagram for explaining a near field and a far field in radio wave propagation between the antenna AT and a wireless terminal.

Next, the near field and the far field will be explained. FIGS. 5A and 5B are schematic diagrams showing how radio waves radiated from the antenna AT toward the wireless terminal 100A are transmitted. The antenna AT is equivalent to the primary radiator 6a1 of the test antenna 6a and the direct-type test antennas 6b, 6c, 6d, 6e, and 6f, which will be described later. The wireless terminal 100A is equivalent to the DUT 100. FIG. 5A shows a DFF (Direct Far Field) method in which radio waves are directly transmitted from the antenna AT to the wireless terminal 100A, while FIG. 5B shows an IFF (Indirect Far Field) method in which radio waves are transmitted from the antenna AT to the wireless terminal 100A through a reflection mirror 7A having a rotating paraboloid.

As shown in FIG. 5A, a radio wave having an antenna AT as a radiation source has a property that a surface (wave surface) connecting points of the same phase spreads spherically around the radiation source and propagates. At this time, interference waves generated by disturbances such as scattering, refraction, and reflection as shown by the broken line are also generated. Further, at a distance close to the radiation source, the wave surface is a curved spherical surface (spherical wave), but at a distance from the radiation source, the wave surface becomes close to a plane (plane wave). In general, the region where the wave surface needs to be considered as a spherical surface is called a near field (NEAR FIELD), and the region where the wave surface can be regarded as a plane is called a far field (FAR FIELD). In the propagation of the radio waves shown in FIG. 5A, it is preferable that the wireless terminal 100A receives a plane wave rather than a spherical wave in order to perform accurate measurement.

In order to receive a plane wave, the wireless terminal 100A needs to be installed in the far field. When the position and antenna size of the antenna 110 in the DUT 100 are not known, the far field is a region beyond $2D_0^2/\lambda$ from the antenna AT, where $D_0$ is the maximum linear size of the wireless terminal 100A, and $\lambda$ is the wavelength of the radio wave.

Specifically, for example, when the maximum linear size of the wireless terminal 100A $D_0$=0.2 m and the radio wave frequency is 43.5 GHz, the position 11.6 m from the antenna AT becomes the boundary between the near field and the far field, so that it becomes necessary to place the wireless terminal 100A at a farther position.

On the other hand, when the position and antenna size of the antenna 110 in the DUT 100 are known, the far field is a region beyond $2D^2/\lambda$ from the antenna AT, where D is the antenna size, and $\lambda$ is the wavelength of the radio wave.

Specifically, for example, when the antenna size D of the wireless terminal 100A is 0.03 m and the radio wave frequency is 43.5 GHz, the position 26.2 cm from the antenna AT becomes the boundary between the near field and the far field, so that it becomes necessary to place the wireless terminal 100A at a farther position. Further, for example, when the antenna size D of the wireless terminal 100A is 0.04 m and the radio wave frequency is 43.5 GHz, the position 46.5 cm from the antenna AT is the boundary between the near field and the far field.

In the present embodiment, the maximum linear size D of the target DUT100 is, for example, about 20 cm, and the frequency range to be handled is assumed to be 24.25 GHz to 43.5 GHz.

FIG. 5B shows a method of arranging the reflection mirror 7A having a rotating paraboloid so as to reflect the radio wave of the antenna AT and bring the reflected wave to the position of the wireless terminal 100A (CATR (Compact Antenna Test Range) method). According to this method, the distance between the antenna AT and the wireless terminal 100A can be reduced, and the plane wave region expands from the distance immediately after the reflection on the mirror surface of the reflection mirror 7A, so that the effect of reducing the propagation loss can be expected. The degree of a plane wave can be expressed by the phase difference of waves of the same phase. The permissible phase difference as the degree of plane wave is, for example, $\lambda/16$. The phase difference can be evaluated, for example, by a vector network analyzer (VNA).

(Test Antennas)

Next, the test antennas 6 will be described.

Figure 8:
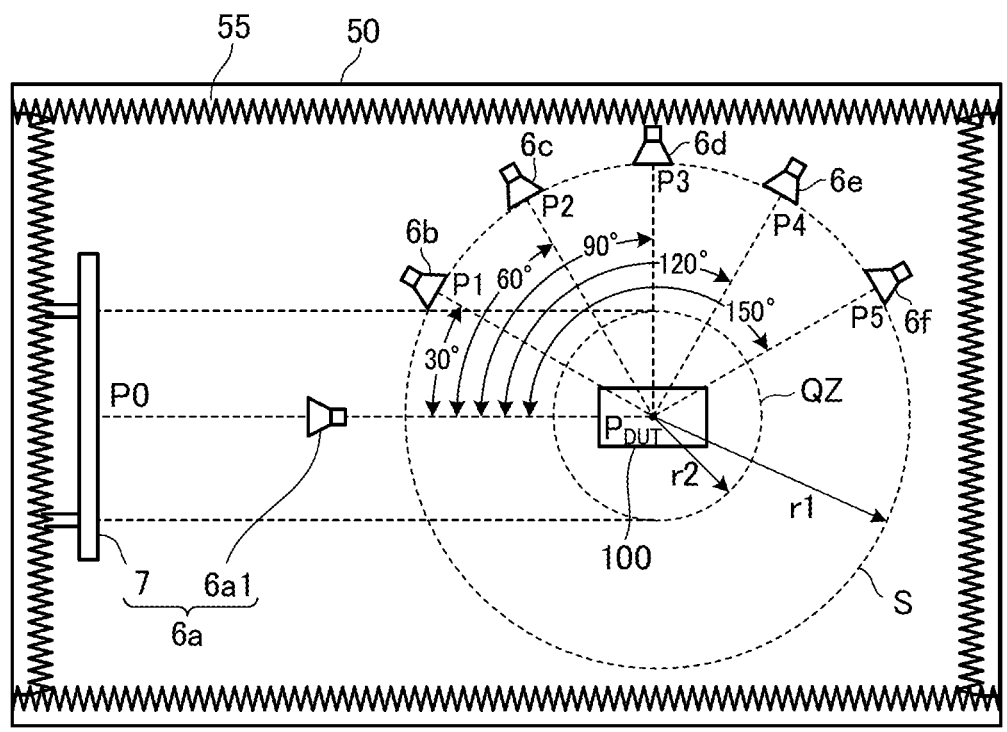
FIG. 8 is a plan view of the OTA chamber of the test device according to the present embodiment seen from the top side with the top plate of the OTA chamber removed.
Figure 8:
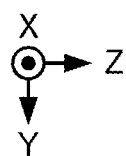
Figure 9:
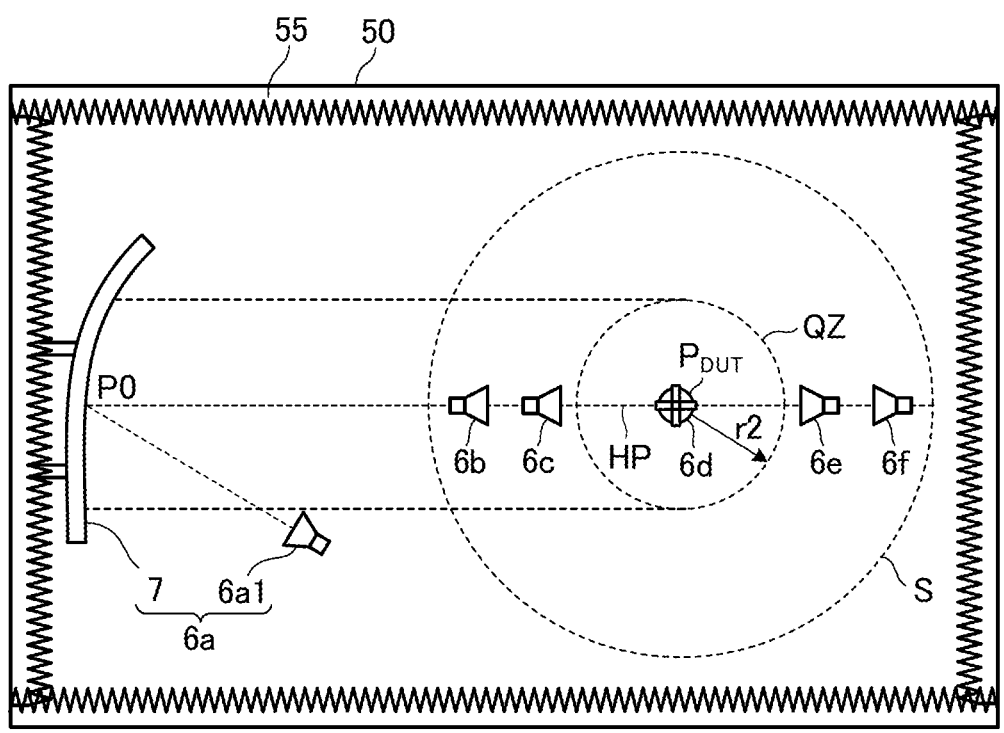
FIG. 9 is a front view of the OTA chamber seen from the front side with the side plate on the front side of the OTA chamber of FIG. 8 removed.
Figure 9:
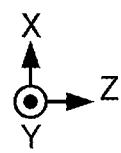

FIG. 8 is a plan view of the OTA chamber 50 of the test device 1 according to the present embodiment seen from the top side with the top plate of the OTA chamber 50 removed, and FIG. 9 is a front view of the OTA chamber 50 seen from the front side with the side plate on the front side of the OTA chamber 50 of FIG. 8 removed.

As shown in FIGS. 8 and 9, the test antennas 6 include a reflection-type test antenna 6a and five direct-type test antennas 6b, 6c, 6d, 6e, and 6f. The reflection-type test antenna 6a transmits or receives a radio signal for measuring the transmission properties or the reception properties of the DUT 100, to or from the antenna 110 through the reflector 7. The direct-type test antennas 6b, 6c, 6d, 6e, and 6f directly transmit or receive a radio signal for measuring the transmission properties or reception properties of the DUT 100, to or from the antenna 110 included in the DUT 100. Each test antenna 6 includes a horizontally polarized antenna and a vertically polarized antenna (see FIG. 2).

(Reflection-Type Test Antenna)

First, the reflection-type test antenna 6a will be described. The reflection-type test antenna 6a includes a primary radiator 6a1 and a reflector 7. The primary radiator 6a1 includes a horizontally polarized antenna 6aH and a vertically polarized antenna 6aV (see FIG. 2). The reflector 7 has an offset parabolic (see FIG. 6) type structure described later. As shown in FIG. 1, the reflector 7 is attached to a required position on the side surface 52b of the OTA chamber 50 by using the reflector holder 58. The reflector 7 receives the radio wave of the test signal radiated from the primary radiator 6a1 arranged at the focal position F determined from the rotating paraboloid on the rotating paraboloid, and reflects the radio wave of the test signal toward the DUT 100 held by the posture changeable mechanism 56 (qt the time of transmission). At the same time, the reflector 7 receives the radio wave of the signal to be measured radiated from the antenna 110 by the DUT 100 that has received the test signal on the rotating paraboloid, and reflects the test signal toward the radiated primary radiator 6a1 (at the time of reception). The reflector 7 is arranged at a position and in a posture in which transmission and reception can be performed at the same time. This means that the reflector 7 reflects the radio wave of the radio signal transmitted and received between the primary radiator 6a1 and the antenna 110 through the rotating paraboloid.

Figure 6:
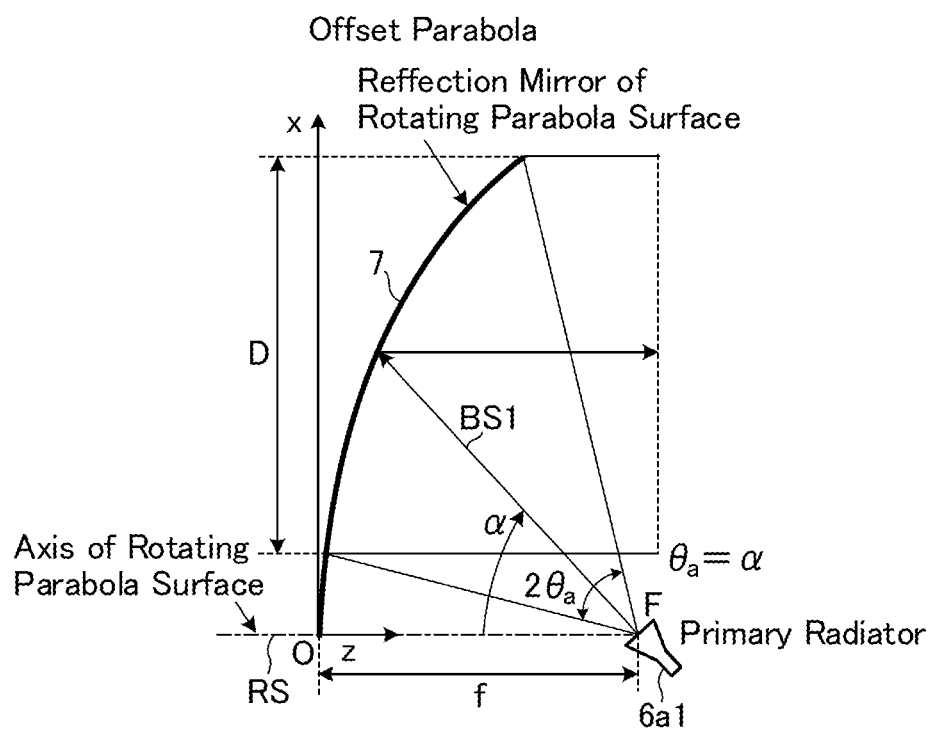
FIG. 6 is a schematic view showing the structure of a reflection-type test antenna used in the test device according to the first embodiment of the present invention.

FIG. 6 is a schematic view showing the structure of the reflection-type test antenna 6a used in the test device 1 according to the present embodiment. The reflector 7 of the reflection-type test antenna 6a is an offset parabola type, and has a mirror surface (a shape obtained by cutting out a part of the rotating parabola surface of a perfect circular parabola) that is asymmetric with respect to the axis of the rotating parabola surface. The primary radiator 6a1 is arranged at the focal position F of the offset parabola in an offset state in which the beam axis BS1 is tilted by, for example, an angle α (for example, 30°) with respect to the axis RS of the rotating paraboloid. By this configuration, radio waves radiated from the primary radiator 6a1 (for example, a test signal for the DUT 100) are reflected on the rotating paraboloid in a direction parallel to the axial direction of the rotating paraboloid, and the axial direction of the rotating paraboloid. Radio waves incident on a rotating paraboloid in a direction parallel to (for example, a signal to be measured transmitted from the DUT 100) can be reflected by the rotating paraboloid and guided to the primary radiator 6a1. Compared to the parabola type, the offset parabola requires the reflector 7 itself to be smaller and can be arranged so that the mirror surface approaches the vertical, so that the structure of the OTA chamber 50 can be miniaturized.

In the OTA chamber 50 according to the present embodiment, as shown in FIG. 1, a reflector 7 using an offset parabola (see FIG. 6) is arranged in a radio wave propagation path between the DUT 100 and the test antenna 6. The reflector 7 is attached to the side surface 52b of the housing body 52 so that the position indicated by reference numeral F in the drawing is the focal position. The primary radiator 6a1 is held at an angle such that it faces the reflector 7 at an elevation angle of 30 degrees, that is, faces the reflector 7, and the receiving surface of the primary radiator 6a1 is perpendicular to the beam axis BS1 of the radio signal.

As described above, the reflection-type test antenna 6a includes a primary radiator 6a1 and a reflector 7, so that the primary radiator 6a1 transmits or receives a radio signal to and from the antenna 110 through the reflector 7. As can be understood from FIG. 9, the primary radiator 6a1 of the reflection-type test antenna 6a is arranged below the horizontal plane HP passing through the arrangement position $P_{DUT}$ of the DUT 100. The radio wave beam emitted from the primary radiator 6a1 and reflected by the reflector 7 is propagated in the Z-axis direction to form a quiet zone QZ having a radius r2. The center of the radio wave beam reflecting the position P0 of the opening center of the reflector 7 is propagated in the Z-axis direction and reaches the arrangement position $P_{DUT}$ of the DUT 100.

(Direct-Type Test Antennas)

Next, the direct-type test antennas 6b, 6c, 6d, 6e, and 6f will be described. The direct-type test antennas 6b, 6c, 6d, 6e, and 6f are designed to directly transmit and receive radio signals to and from the antenna 110 without using a reflector. The direct-type test antennas 6b, 6c, 6d, 6e and 6f have horizontally polarized antennas 6bH, 6cH, 6dH, 6eH and 6fH, respectively, and vertically polarized antennas 6bV, 6cV, 6dV, 6eV and 6fV, respectively (See FIG. 2). These direct-type test antennas 6b, 6c, 6d, 6e, and 6f are arranged on a virtual spherical surface S having a radius r1 and on a horizontal plane HP with the arrangement position $P_{DUT}$ of the DUT 100 as the center. The description "The test antenna is arranged on the virtual spherical surface S and on the horizontal plane HP" means that the centers P1, P2, P3, P4, P5 of the radiation openings of the test antennas 6b, 6c, 6d, 6e, 6f are located on the virtual sphere S and on the horizontal plane HP. As shown in FIG. 1, the direct-type test antennas 6b, 6c, 6d, 6e, and 6f may be arranged on a virtual spherical surface S having a radius r1 and on a vertical plane centering on the arrangement position $P_{DUT}$ of the DUT 100. The test antennas 6b, 6c, 6d, 6e, and 6f do not have to be located at the same distance from the DUT100, and the test antennas 6b, 6c, 6d, 6e, and 6f may have different distances.

In the present embodiment, the direct-type test antennas 6b, 6c, 6d, 6e, and 6f form different arrival angles with respect to the radio wave arrival direction from the reflection-type test antenna 6a at the arrangement position $P_{DUT}$ of the DUT 100. By this configuration, the arrival angle varies depending on the combination of the reflection-type test antenna 6a and one of the direct-type test antennas 6b, 6c, 6d, 6e, 6f. Therefore, it is possible to efficiently perform far field measurement of transmission/reception properties such as the RRM properties of the DUT100, by switching between the direct-type test antennas 6b, 6c, 6d 6e and 6f, so that the arrival angle can be changed.

Specifically, the direct-type test antenna 6b forms an arrival angle of a predetermined angle θ with respect to the radio wave arrival direction (Z axis) from the reflection-type test antenna 6a at the arrangement position $P_{DUT}$ of the DUT 100, and similarly. In addition, the direct-type test antennas 6c, 6d, 6e, and 6f form arrival angles of 2θ, 3θ, 4θ, and 5θ, respectively. This means that the direct-type first to fifth test antennas 6b, 6c, 6d, 6e, and 6f can realize relative arrival angles θ, 2θ, 3θ, 4θ, and 5θ together with the reflection-type test antennas 6a. Thus, it is possible to measure within a predetermined angle range evenly and without leakage, so that the measurement of the transmission/reception properties in the far field such as the RRM properties of the DUT 100 can be performed accurately.

Here, the "arrival angle (AoA)" means the angle that the center of the radio wave beam or the radio wave beam arriving at the arrangement position $P_{DUT}$ from the test antenna forms with respect to a specific straight line (for example, the Z axis) passing through the arrangement position $P_{DUT}$ of the DUT 100. The arrival angle can also be defined by two test antennas. In this case, the angle that the center of the radio wave beam or the radio wave beam arriving at the arrangement position $P_{DUT}$ from the other test antenna forms with respect to the radio wave arrival direction which is the direction of the radio wave beam arriving at the arrangement position $P_{DUT}$ from the one test antenna is referred to as "arrival angle" or "relative arrival angle".

In the present embodiment, the predetermined angle θ is 30°. This means that the direct-type test antenna 6b forms an arrival angle of 30° with respect to the radio wave arrival direction (Z axis) from the reflection-type test antenna 6a at the arrangement position $P_{DUT}$ of the DUT 100, and similarly, the direct-type test antennas 6c, 6d, 6e, and 6f forms the arrival angles 60°, 90°, 120°, and 150°, respectively. This makes it possible to measure the RRM properties specified in Standard 3GPP TR 38.810 V16.2.0 (2019-03).

In the case where the antenna size D of the antenna 110 is known, the direct-type test antennas 6b, 6c, 6d, 6e, 6f can be located at least $2D^2/\lambda$ away from the antenna 110 of the DUT 100. Here, D is the antenna size of the antenna 110, and λ is the wavelength of the radio wave transmitted from the direct-type test antennas 6b, 6c, and 6d. This makes it possible to measure the far field of the DUT 100.

Further, the reflection-type test antenna 6a forms an indirect far field (IFF), and the direct-type test antennas 6b, 6c, 6d, 6e, 6f form a direct far field (DFF). The indirect far field means a far field formed by a reflection-type antenna using a reflector, and the direct far field means a far field formed by a direct-type antenna without using a reflector.

The direct-type test antennas 6b, 6c, 6d, 6e, and 6f are arranged outside the path of the radio wave beam passing through the quiet zone QZ by reflecting the reflector 7 of the reflection-type test antenna 6a. By this configuration, the test device 1 according to the present embodiment can form a favorable quiet zone QZ.

In the present embodiment, six test antennas are provided, but the number is not limited to this, and the number of reflection-type test antennas may be set to 1 and the number of direct-type test antennas may be set to any number of 2 or more depending on the test content.

Further, in the present embodiment, the quiet zone formed by the direct-type test antennas 6b, 6c, 6d, 6e, and 6f is the same as the quiet zone QZ formed by the reflection-type test antenna 6a, but it is not limited to this. The quiet zone formed by the direct-type test antennas 6b, 6c, 6d, 6e, and 6f may be different from the quiet zone QZ formed by the reflection-type test antenna 6a. For example, if the quiet zone QZ formed by the reflection-type test antenna 6a is made wider, a wider quiet zone can be used when the reflection-type test antenna 6a is used alone to measure RF properties and the like.

Next, the integrated control device 10 and the NR system simulator 20 of the test device 1 according to the present embodiment will be described with reference to FIGS. 2 to 4.

(Integrated Control Device)

The integrated control device 10 comprehensively controls the NR system simulator 20 and the posture changeable mechanism 56, as described below. For this purpose, the integrated control device 10 is communicably connected to the NR system simulator 20 and the posture changeable mechanism 56 through a network 19 such as Ethernet (registered trademark).

Figure 3:
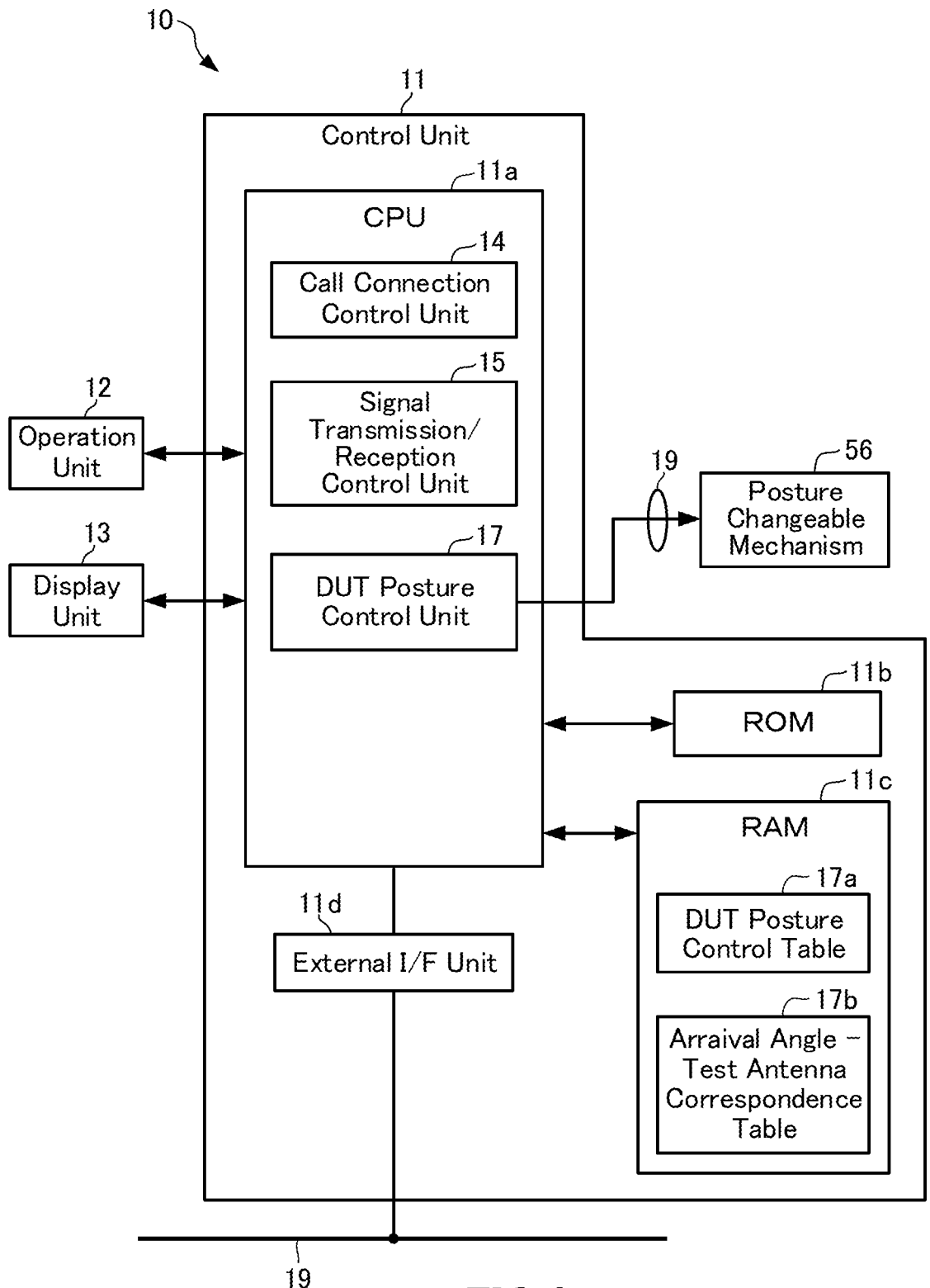
FIG. 3 is a block diagram showing a functional configuration of an integrated control device of the test device according to the first embodiment of the present invention.

FIG. 3 is a block diagram showing a functional configuration of the integrated control device 10. As shown in FIG. 3, the integrated control device 10 includes a control unit 11, an operation unit 12, and a display unit 13. The control unit 11 is composed of, for example, a computer device. In this computer device, for example, as shown in FIG. 3, the computer device has a CPU (Central Processing Unit) 11a, a ROM (Read Only Memory) 11b, a RAM (Random Access Memory) 11c, an external interface (I/F) unit 11d, a non-volatile storage medium such as a hard disk device and various input/output ports not shown.

The CPU 11a is designed to perform comprehensive control of the NR system simulator 20. The ROM 11b stores an OS (Operating System) for starting up the CPU 11a, other programs, control parameters, and the like. The RAM 11c is designed to store execution codes, data, and the like of the OS and applications used by the CPU 11a for operation. The external interface (I/F) unit 11d has an input interface function for inputting a predetermined signal and an output interface function for outputting a predetermined signal.

The external I/F unit 11d is communicably connected to the NR system simulator 20 through the network 19. Further, the external I/F unit 11d is also connected to the posture changeable mechanism 56 in the OTA chamber 50 through the network 19. An operation unit 12 and a display unit 13 are connected to the input/output port. The operation unit 12 is a functional unit for inputting various information such as commands, and the display unit 13 is a functional unit for displaying various information such as an input screen for the various information and measurement results.

The computer device described above functions as a control unit 11 when the CPU 11a executes a program stored in the ROM 11b with the RAM 11c as a work area. As shown in FIG. 3, the control unit 11 includes a call connection control unit 14, a signal transmission/reception control unit 15, and a DUT posture control unit 17. The call connection control unit 14, the signal transmission/reception control unit 15, and the DUT posture control unit 17 are also realized by the CPU 11a executing a predetermined program stored in the ROM 11b in the work area of the RAM 11c.

The call connection control unit 14 performs a control to establish a call (a state in which a radio signal can be transmitted and received) between the NR system simulator 20 and the DUT 100, by driving the test antenna 6 to transmit and receive a control signal (wireless signal) to and from the DUT 100.

The signal transmission/reception control unit 15 monitors the user operation in the operation unit 12, and transmits a signal transmission command to the NR system simulator 20 through the call connection control of the call connection control unit 14, triggered by a predetermined measurement start operation by the user related to the measurement of the transmission properties and the reception properties of the DUT 100. Further, the signal transmission/reception control unit 15 controls the NR system simulator 20 to transmit a test signal through the test antennas 6, and controls the NR system simulator 20 to transmit the signal reception command and to receive a signal to be measured through the test antennas 6.

In addition, the signal transmission/reception control unit 15 is adapted to set the arrival angle and select the test antenna to be used in the transmission/reception properties test the RRM properties and the like performed by using the two test antennas. Specifically, one of a plurality of predetermined arrival angles (for example, 30°, 60°, 90°, 120°, 150°) is selected and set as a measurement condition (stored in RAM 11c or the like). The arrival angle may be selected by the user, or may be automatically selected by the control unit 11 or the like. The signal transmission/reception control unit 15 selects the test antenna to be used from the plurality of test antennas 6 based on the set arrival angle. For example, when the set arrival angle is 30°, the signal transmission/reception control unit 15 selects the reflection-type test antenna 6a and the direct-type first test antenna 6b as the test antenna to be used. For this reason, for example, the ROM 11b stores in advance an arrival angle-test antenna correspondence table 17b showing the correspondence relationship between the arrival angle and the test antenna. The arrival angle may be set and the test antenna to be used may be selected by the control unit 11 or the control unit 22 of the NR system simulator 20.

The DUT posture control unit 17 controls the posture of the DUT 100 held by the posture changeable mechanism 56 at the time of measurement. In order to realize this control, for example, the DUT posture control table 17a is stored in advance in the ROM 11b. For example; when the stepping motor is adopted as the drive unit 56a, the DUT posture control table 17a stores the number of drive pulses (number of operation pulses) that determine the rotational drive of the stepping motor as control data.

The DUT posture control unit 17 lays out the DUT posture control table 17a on the work area of the RAM 11c, and drives and controls the posture changeable mechanism 56 so that the DUT 100 makes the antenna 110 sequentially face in all three-dimensional directions as described above based on the DUT posture control table 17a.

(NR System Simulator)

Figure 4:
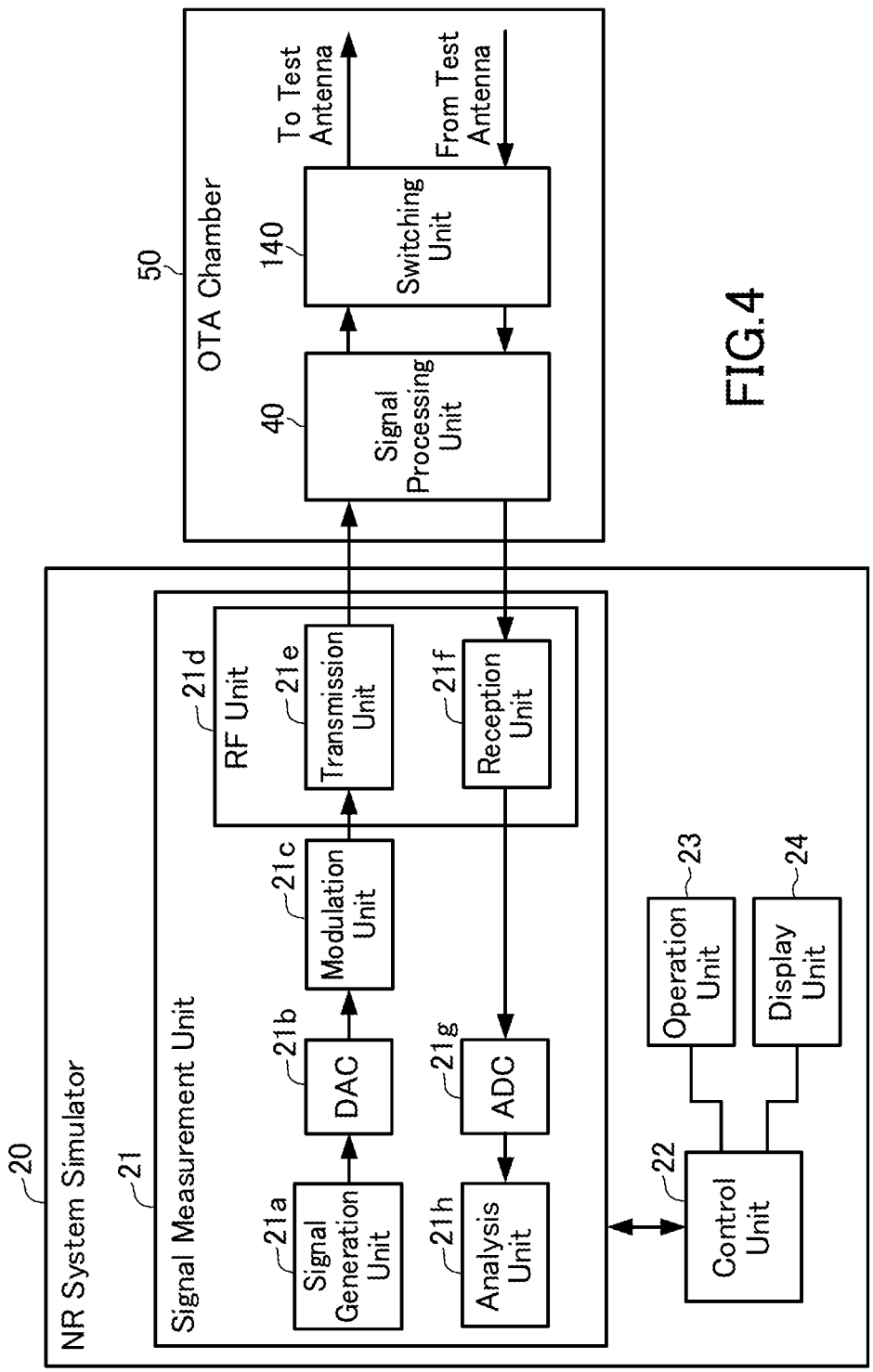
FIG. 4 is a block diagram showing a functional configuration of an NR system simulator in the test device according to the first embodiment of the present invention.

As shown in FIG. 4, the NR system simulator 20 of the test device 1 according to the present embodiment has a signal measurement unit 21, a control unit 22, an operation unit 23, and a display unit 24. The signal measurement unit 21 includes: a signal generation function unit including a signal generation unit 21a, a digital/analog converter (DAC) 21b, a modulation unit 21c, a, transmission unit 21e of the RF unit 21d, and a reception unit 21f of the RF unit 21d; and a signal analysis function unit including an analog/digital converter (ADC) 21g and an analysis unit 21h. The signal measurement unit 21 may be provided with two sets thereof, so as to correspond to the two test antennas to be used.

In the signal generation function unit of the signal measurement unit 21, the signal generation unit 21a generates waveform data having a reference wave, specifically, for example, an I component baseband signal and a Q component baseband signal which is an orthogonal component signal thereof. The DAC 21b converts waveform data (I component baseband signal and Q component baseband signal) having a reference waveform outputted from the signal generation unit 21a from a digital signal to an analog signal, and outputs the waveform data to the modulation unit 21c. The modulation unit 21c mixes a local signal with each of the I component baseband signal and the Q component baseband signal, and further synthesizes both to output a digital modulation signal. The RF unit 21d generates a test signal corresponding to the frequency of each communication standard from the digital modulation signal outputted from the modulation unit 21c, and outputs the generated test signal by the transmission unit 21e to the DUT 100 through the signal processing unit 40 and the test antenna.

Further, in the signal analysis function unit of the signal measurement unit 21, the RF unit 21d receives the signal to be measured that is transmitted from the DUT 100, which has received the test signal by the antenna 110, by the reception unit 21f though the signal processing unit 40, and mixes the signal to be measured with the local signal, to be converted into an intermediate frequency band signal (IF signal). The ADC 21g converts the analog signal to be measured, which is converted into an IF signal by the receiving unit 21f of the RF unit 21d, into a digital signal and outputs the digital signal to the analysis unit 21h.

The analysis unit 21h generates waveform data corresponding to the I component baseband signal and the Q component baseband signal by digital processing of the signal to be measured, which is a digital signal outputted by the ADC 21g, and then analyzes the waveform data based on the I component baseband signal and the Q component baseband signal. In the measurement of the transmission properties (RF properties) with respect to the DUT 100, the analysis unit 21h can measure, for example, equivalent isotopically radiated power (EIRP), total radiated power (TRP), spurious radiation, and modulation accuracy. (EVM), transmission power, constellation, spectrum, and the like. Further, the analysis unit 21h can measure, for example, the reception sensitivity, the bit error rate (BER), the packet error rate (PER), and the like in the measurement of the reception properties (RF properties) with respect to the DUT 100. Here, EIRP is the radio signal strength in the main beam direction of the antenna under test. Further, TRP is the total value of the electric power radiated into the space from the antenna under test.

The analysis unit 21h can also analyze the RRM properties of the DUT 100, for example, whether or not the handover operation from one selected test antenna to another selected test antenna is normally performed.

The control unit 22 includes, for example, a computer device including a CPU, RAM, ROM, and various input/output interfaces, like the control unit 11 of the integrated control device 10 described above. The CPU performs predetermined information processing and control for realizing each function of the signal generation function unit, the signal analysis function unit, the operation unit 23, and the display unit 24.

The operation unit 23 and the display unit 24 are connected to the input/output interface of the computer device. The operation unit 23 is a functional unit for inputting various information such as commands, and the display unit 24 is a functional unit for displaying various information such as the input screen of the various information and the measurement result.

In the present embodiment, the integrated control device 10 and the NR system simulator 20 are separate devices, but they may be configured as one device. In this case, the control unit 11 of the integrated control device 10 and the control unit 22 of the NR system simulator 20 may be integrated and realized by one computer device.

Next, the signal processing unit 40 and the signal switching unit 140 will be described.

Figure 7:
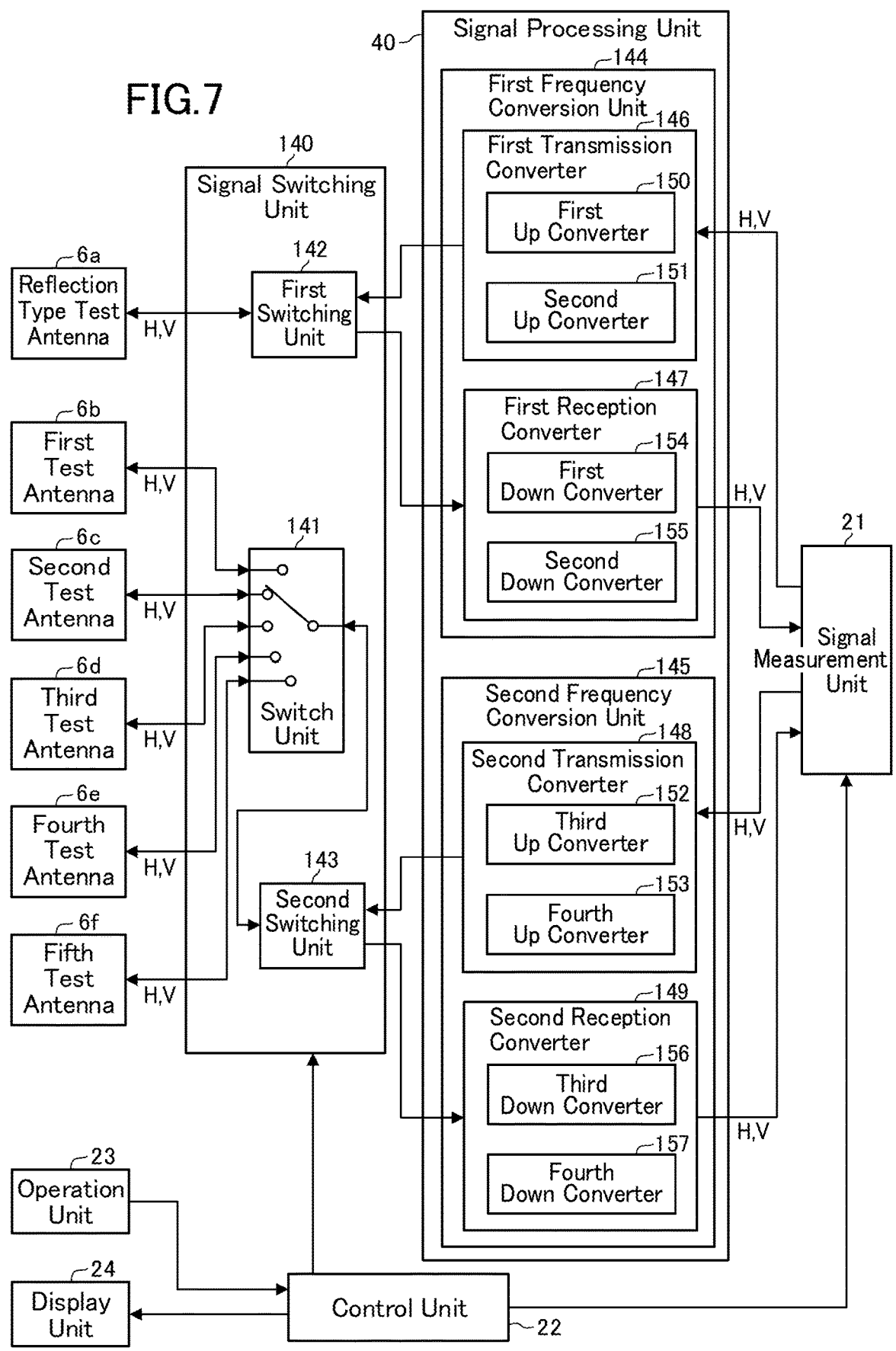
FIG. 7 is a block diagram showing a functional configuration of a signal processing unit and a signal switching unit according to the first embodiment of the present invention.

FIG. 7 is a block diagram showing a functional configuration of the signal processing unit 40 and the signal switching unit 140 according to the embodiment of the present invention. The signal processing unit 40 and the signal switching unit 140 are arranged inside the OTA chamber 50.

(Signal Processing Unit)

As shown in FIG. 7, the signal processing unit 40 performs processing such as converting the frequency of the signal transmitted as a radio signal by the test antennas 6 or the frequency of the radio signal received by the test antennas 6, and is provided with a first frequency conversion unit 144 and a second frequency conversion unit 145.

The first frequency conversion unit 144 converts the frequency of the radio signal transmitted and received to and from the reflection-type test antenna 6a and the antenna 110. Specifically, the first frequency conversion unit 144 includes a first transmission converter 146 that up-converts the signal transmitted as a radio signal from the reflection-type test antenna 6a, and a first reception converter 147 that down-converts the radio signal received by the reflection-type test antenna 6a.

More specifically, the first transmission converter 146 of the first frequency conversion unit 144 includes a first up-converter 150 that up-converts the signal transmitted as a horizontally polarized radio signal from the reflection-type test antenna 6a, and a second up-converter 151 that up-converts a signal transmitted as a vertically polarized radio signal from the reflection-type test antenna 6a.

Further, the first reception converter 147 of the first frequency conversion unit 144 includes a first down-converter 154 that down-converts the horizontally polarized radio signal received from the reflection-type test antenna 6a, and a second down converter 155 that down-converts a vertically polarized radio signal received from the antenna 6a.

By the above configuration, the test device 1 according to the present embodiment can measure transmission/reception properties such as RRM properties of the DUT 100 using a horizontally polarized wave signal and a vertically polarized wave signal.

The second frequency conversion unit 145 is adapted to convert the frequency of the radio signal transmitted/received between the direct-type test antennas 6b, 6c, 6d, 6e, 6f and the antenna 110. Specifically, the second frequency conversion unit 145 includes a second transmission converter 148 that up-converts the signal transmitted as a radio signal from the direct-type test antennas 6b, 6c, 6d, 6e, and 6f, and a second reception converter 149 that down-converts the radio signal received by the type test antennas 6b, 6c, 6d, 6e, 6f.

More specifically, the second transmission converter 148 of the second frequency converter 145 transmits a signal transmitted as a horizontally polarized radio signal from the direct test antennas 6b, 6c, 6d, 6e, 6f. A third upconverter 152 for up-converting and a fourth upconverter 153 for up-converting signals transmitted as vertically polarized radio signals from direct test antennas 6b, 6c, 6d, 6e, 6f are provided.

Further, the second reception converter 149 of the second frequency conversion unit 145 includes a third down-converter that down-converts the horizontally polarized radio signal received from the direct-type test antennas 6b, 6c, 6d, 6e, 6f, and a fourth down-converter 157 that down-converts the vertically polarized radio signals received from the direct test antennas 6b, 6c, 6d, 6e, 6f.

As described above, in the test device 1 according to the present embodiment can measure the RRM properties and the like by using the reflection-type test antenna 6a and the direct-type one test antenna, since the first frequency conversion unit 144 is provided for the reflection-type test antenna 6a, and the second frequency conversion unit 145 is provided for the direct-type test antennas 6b, 6c, 6d, 6e.

(Signal Switching Unit)

The signal switching unit 140 includes a switch unit 141, a first switching unit 142, and a second switching unit 143.

The switch unit 141 switches a signal path between the second frequency conversion unit 145 and the direct-type test antennas 6b, 6c, 6d, 6e, 6f, to a signal path that connects one of the direct-type test antennas selected and the second frequency conversion unit 145. The switching of the signal path can be automatically performed under the control of the control unit 22, but it may be performed manually. The switch unit 141 of the present embodiment corresponds to the switching unit of the present invention.

The first switching unit 142 is provided between the reflection-type test antenna 6a and the first frequency conversion unit 144, and the reflection-type test antenna 6a is shared for transmission and reception. The second switching unit 143 is provided between the switch unit 141 and the second frequency conversion unit 145, so that one of the direct test antennas selected from among the test antennas is shared by transmission and reception.

Specifically, the first switching unit 142 is, for example, a wideband directional coupler that passes the frequency of the test signal outputted from the first transmission converter 146, and is constituted by, for example, a Wilkinson type distributor. The first switching unit 142 is connected to the reflection-type test antenna 6a by a coaxial cable, so that the first switching unit 142 can input the test signal that is outputted from the first transmission converter 146 to the reflection-type test antenna 6a, and at the same time input the signal to be measured from the DUT 100 that is received by the reflection-type test antennas 6a to the first reception converter 147. The first switching unit 142 may be constituted by, for example, a circulator.

Similarly, the second switching unit 143 is, for example, a wideband directional coupler that allows the frequency of the test signal outputted from the second transmission converter 148 to pass, and is constituted by, for example, a Wilkinson-type distributor. The second switching unit 143 is connected to the switch unit 141 with a coaxial cable, so that the second switching unit 143 can input the test signal that is outputted from the second transmission converter 148 to the direct-type one test antenna 6 through the switch unit 141, and at the same time, input the signal to be measured from the DUT 100 that is received by one of the direct-type one test antennas 6 to the second reception converter 149. The second switching unit 143 may be configured by, for example, a circulator. Further, an amplifier and a switch for switching between up-link and down-link may be provided in the vicinity of each test antenna 6, between the reflection-type test antenna 6a and the direct-type test antenna 6b, 6c, 6d, 6e, 6f and the signal switching unit 140, for the purpose of compensating for a large loss due to a long wiring from the first frequency conversion unit 144 and the second frequency conversion unit 145 to the test antenna 6, and further preventing pressure of the dynamic range.

The test device 1 according to the present embodiment is provided with a switch unit 141 that allows the signal switching unit 140 in the measurement device 2 to switch a signal path between the signal processing unit 40 and the plurality of the direct-type test antennas 6b, 6c, 6d, 6e, 6f, the signal switching unit 140 of the measuring device 2 sets a signal path between the signal processing unit 40 and the plurality of direct-type test antennas 6b, 6c, 6d, 6e, 6f to a signal path that connects one antenna used from among the plurality of the direct-type test antennas and the signal processing unit 40. By this configuration, the number of signal processing units is reduced as compared with conventional test devices in which the signal processing units are provided for each of the plurality of test antennas 6, so that cost reduction and space saving can be realized.

Further, since the test device 1 according to the present embodiment can share the test antenna 6 for transmission and reception by using the first switching unit 142 and the second switching unit 143, the transmission properties and reception properties of the DUT 100 can be efficiently measured.

Next, the operations of the signal processing unit 40 and the signal switching unit 140 according to the present embodiment will be described. Here, a case where the transmission/reception properties of the DUT 100 are measured by using the reflection-type test antenna 6a and the direct-type test antenna 6c will be described as an example.

First, the first switching unit 142 has a function of enabling the reflection-type test antenna 6a to be shared by transmission and reception. Specifically, the first switching unit 142 forms a signal path from the first transmission converter 146 to the reflection-type test antenna 6a, and at the same time, a signal path from the reflection-type test antenna 6a to the first reception converter 147.

More specifically, the first switching unit 142 forms a signal path from the first up-converter 150 to the horizontally polarized antenna 6aH of the reflection-type test antenna 6a, and a signal path from the second upconverter 151 to the vertically polarized antenna 6aV of the reflection-type test antenna 6a. And, at the same time, the first switching unit 142 forms a signal path from the horizontally polarized antenna 6Ha of the reflection-type test antenna 6a to the first down-converter 154, and a signal path from the vertically polarized antenna 6aV of the reflection-type test antenna 6a to the second down-converter 155.

The switch unit 141 switches the signal path so that the selected direct-type test antenna 6c and the second switching unit 143 are connected.

The second switching unit 143 has a function of enabling the selected direct-type test antenna 6c to be shared by transmission and reception. Specifically, the second switching unit 143 has a signal path from the second transmission converter 148 to the selected direct-type test antenna 6c, and a signal path from the selected direct-type test antenna 6c to the second reception converter 149.

More specifically, the second switching unit 143 forms a signal path from the third upconverter 152 to the horizontally polarized antenna 6cH of the direct-type test antenna 6c, and a signal path from the fourth upconverter 153 to the vertically polarized antenna 6cV of the direct-type test antenna 6c. And, at the same time, the second switching unit 143 forms a signal path from the horizontally polarized antenna 6cH to the third down-converter 156, and a signal path from the vertically polarized antenna 6cV of the direct-type test antenna 6c to the fourth down-converter 157.

Then, the horizontally polarized modulation signal sent from the signal measuring unit 21 to the first upconverter 150 is up-converted by the first upconverter 150, sent to the horizontally polarized antenna 6aH of the reflection-type test antenna 6a, and radiated from the horizontally polarized antenna 6aH. Similarly, the vertically polarized modulation signal sent from the signal measuring unit 21 to the second upconverter 151 is up-converted by the second upconverter 151, sent to the vertically polarized antenna 6aV of the reflection-type test antenna 6a, and radiated from the vertically polarized antenna 6aV.

The radio wave radiated from the reflection-type test antenna 6a is reflected by the reflector 7 and sent to the DUT 100, and is received by the antenna 110. The DUT 100 transmits a response signal in response to the received signal.

With respect to the response signal transmitted from the DUT 100, for example, the direct-type test antenna 6c receives the response signal. Then, the horizontally polarized signal received by the horizontally polarized antenna 6cH of the direct-type test antenna 6c is down-converted by the third down converter 156, sent to the signal measuring unit 21, demodulated, and subjected to analysis processing.

Similarly, the vertically polarized signal received by the vertically polarized antenna 6cV of the direct-type test antenna 6c is down-converted by the fourth down converter 157, sent to the signal measuring unit 21, demodulated, and subjected to analysis processing.

In the above example, the test signal is transmitted from the reflection-type test antenna 6a to the DUT 100, and the signal to be measured which is transmitted from the DUT 100 is received by the direct-type test antenna 6c for analysis. But the test method is not limited to this. The test signal transmitted from the DUT 100 may be received by one of the test antennas 6 and analyzed, or the test signal transmitted from any of the test antennas 6 may be received by the DUT 100 and analyzed. The test antenna 6 used may be one or two.

As described above, the signal processing unit 40 includes a first frequency conversion unit 144 and a second frequency conversion unit 145, but also includes an amplifier, a frequency filter, and the like, and frequency conversion, amplification, and frequency selection, and the like are to be performed.

(Test method)

Next, a test method performed using the test device 1 according to the present embodiment will be described with reference to the flowchart of FIG. 10. Hereinafter, the test performed using two test antennas (for example, measurement of transmission/reception properties such as RRM properties) will be described, but this is an example of a test method, and it goes without saying that the specific test method differs depending on the type of test.

First, the user uses the operation unit 12 of the integrated control device 10 to perform a measurement start operation instructing the control unit 11 to start measuring the transmission properties and the reception properties of the DUT 100. This measurement start operation may be performed by the operation unit 23 of the NR system simulator 20.

Next, the user sets the DUT 100 to be tested on the DUT mounting unit 56d of the posture changeable mechanism 56 provided in the internal space 51 of the OTA chamber 50 (Step S1).

The control unit 11 sets one of the predetermined arrival angles (Step S2). For example, when the predetermined arrival angles are 30°, 60°, 90°, 120°, and 150°, the control unit 11 selects one of the arrival angles (for example, 30°) and sets the selected arrival angle is set (for example, stored in RAM 11c) as the arrival angle to be measured. The setting of the arrival angle may be done by the user.

Next, the control unit 11 selects two test antennas 6 that realize the arrival angle from the arrival angle set in Step S2 (Step S3). For example, when the set arrival angle is 30°, the test antenna 6a and the test antenna 6b are selected, and when the set arrival angle is 60°, the test antenna 6a and the test antenna 6c are selected, when the set arrival angle is 90°, the test antenna 6a and the test antenna 6d are selected, and when the set arrival angle is 120°, the test antenna 6a and the test antenna 6e are selected, and when the arrival angle is 150°, the test antenna 6a and the test antenna 6f are selected.

Next, the control unit 22 of the NR system simulator 20 switches the signal path to the selected test antenna 6 (Step S4). Specifically, the control unit 22 of the NR system simulator acquires the information of the two selected test antennas from the control unit 11 and transmits the switching signal to the signal switching unit 140 of the signal processing unit 40. The switch unit 141 switches to a signal path to which the selected direct-type test antenna and the second frequency conversion unit 145 are connected according to the switching signal. FIG. 7 shows, as an example, a state in which the second test antenna 6c and the second frequency conversion unit 145 are switched to a signal path to which they are connected. The switch unit 141 can switch to any one of the direct-type first to fifth test antennas 6b, 6c, 6d, 6e, and 6f.

The call connection control unit 14 of the control unit 11 uses the selected test antenna 6 and performs call connection control by transmitting and receiving a control signal (radio signal) to and from the DUT 100 (Step S5). Specifically, the NR system simulator 20 wirelessly transmits a control signal (call connection request signal) having a predetermined frequency to the DUT 100 through the test antenna 6. On the other hand, the DUT 100 that has received the call connection request signal returns a control signal (call connection response signal) after setting the frequency for which the connection is requested. The NR system simulator 20 receives this call connection response signal and confirms that the response has been performed normally. A series of these processes constitute call connection control. This call connection control establishes a state in which a radio signal of a predetermined frequency can be transmitted and received between the NR system simulator 20 and the DUT 100 through the selected test antenna 6.

The process of receiving the radio signal transmitted from the NR system simulator 20 through the test antenna 6 by the DUT 100 is called a downlink (DL) process. Conversely, the process of transmitting a radio signal from the DUT 100 to the NR system simulator 20 through the test antenna 6 is called an uplink (UL) process. The test antenna 6 is used to perform the process of establishing the link (call) and the process of downlink (DL) and uplink (UL) after the link is established, and also functions as a link antenna.

After the call connection is established in Step S5, the DUT posture control unit 17 of the integrated control device 10 controls the posture of the DUT 100 arranged in the quiet zone QZ to a predetermined posture by the posture changeable mechanism 56 (Step S6).

After the DUT 100 is controlled to a predetermined posture by the posture changeable mechanism 56, the signal transmission/reception control unit 15 of the integrated control device 10 transmits a signal transmission command to the NR system simulator 20. The NR system simulator 20 transmits a test signal to the DUT 100 through the selected test antenna 6 based on the signal transmission command (Step S7).

The test signal transmission control by the NR system simulator 20 is performed as follows. In the NR system simulator 20 (see FIG. 4), the signal generation unit 21a generates a signal for generating a test signal under the control of the control unit 22 that has received the signal transmission command. Next, the DAC 21b performs digital/analog conversion processing on the signal generated by the signal generation unit. Next, the modulation unit 21c performs modulation processing on the analog signal obtained by the digital/analog conversion. Next, the RF unit 21d generates a test signal corresponding to the frequency of each communication standard from the modulated signal, and the transmission unit 21e sends this test signal (DL data) to the signal processing unit 40.

The signal processing unit 40 is provided in the OTA chamber 50, performs signal processing such as frequency conversion (up-conversion), amplification, and frequency selection, and outputs the signal to the switching unit 140. The switching unit 140 transmits the signal processed by the signal processing unit 40 to the selected test antenna 6, and the test antenna 6 outputs the signal toward the DUT 100.

The signal transmission/reception control unit 15 controls to transmit the test signal at an appropriate timing after starting the control of the test signal transmission in Step S6 until the measurement of the transmission properties and the reception properties of the DUT 100 is completed.

On the other hand, the DUT 100 receives the test signal (DL data) transmitted through the test antenna 6 by the antenna 110 in a state of different postures that are sequentially changed based on the posture control in Step S6, and transmits the signal to be measured, which is a response signal to the test signal.

After starting the transmission of the test signal in Step S7, the reception process is subsequently performed under the control of the signal transmission/reception control unit 15 (Step S8). In this reception process, the test antenna 6 receives the signal to be measured transmitted from the DUT 100 that has received the test signal, and outputs the signal to be measured to the signal switching unit 140. The signal switching unit 140 switches the signal path and outputs the signal to be measured to the signal processing unit 40. The signal processing unit 40 performs signal processing such as frequency conversion (down-conversion), amplification, and frequency selection, and outputs the signal to the NR system simulator 20.

The NR system simulator 20 performs a measurement processing for measuring the frequency-converted signal to be measured by the signal processing unit 40 (Step S9).

Specifically, the receiving unit 21f of the RF unit 21d of the NR system simulator 20 inputs the signal to be measured that has been signal-processed by the signal processing unit 40. Under the control of the control unit 22, the RF unit 21d converts the signal to be measured which has been inputted to the reception unit 21f into an IF signal having a lower frequency. Next, the ADC 21g converts the IF signal from an analog signal to a digital signal and outputs the IF signal to the analysis unit 21h under the control of the control unit 22. The analysis unit 21h generates waveform data corresponding to the I component baseband signal and the Q component baseband signal, respectively. Further, the analysis unit 21h analyzes the signal to be measured based on the above-mentioned generated waveform data under the control of the control unit 22.

More specifically, in the NR system simulator 20, the analysis unit 21h measures the transmission properties and the reception properties of the DUT 100 based on the analysis result of the signal to be measured, under the control of the control unit 22.

For example, the transmission properties (RF properties) of the DUT100 are measured as follows. First, the NR system simulator 20 transmits a request frame for transmitting an uplink signal as a test signal under the control of the control unit 22. The DUT 100 transmits the uplink signal frame as a signal to be measured to the NR system simulator 20 in response to the request frame for transmitting the uplink signal. The analysis unit 21h performs a process of evaluating the transmission properties of the DUT 100 based on the uplink signal frame.

Further, the reception properties (RF properties) of the DUT100 are, for example, measured as follows. Under the control of the control unit 22, the analysis unit 21h calculates a ratio of the number of transmissions of the measurement frames received from the NR simulator 20 as the test signals and the number of receptions of ACKs and NACKs transmitted from the DUT 100 with respect to the measurement frames as the signals to be measured as the error rate (BER).

Furthermore, regarding the RRM properties of the DUT 100, for example, the analysis unit 21h may test whether or not a handover operation from one selected test antenna to another selected test antenna under the control of the control unit 22 is normally performed, and the like, by changing the posture of the DUT 100.

In Step S9, the analysis unit 21h stores the measurement results of the transmission properties and the reception properties of the DUT 100 in a storage area such as a RAM (not shown) under the control of the control unit 22.

Next, the control unit 11 of the integrated control device 10 determines whether or not the measurement of the transmission properties and the reception properties of the DUT 100 has been completed for all the desired postures (Step S10). Here, if it is determined that the measurement has not been completed (NO in Step S10), the process returns to Step S6 to continue the process.

When it is determined that the measurement has been completed for all postures (YES in Step S10), the control unit 11 determines whether or not the measurement has been completed for all the arrival angles (Step S11).

When it is determined that the measurement has not been completed for all the arrival angles (NO in Step S11), the control unit 11 returns to Step S2 and continues the process. When it is determined that the measurement has been completed for all the arrival angles (YES in Step S11), the control unit 11 ends the test.

Next, the action and effect of this embodiment will be described.

The test device 1 according to the present embodiment is provided with a switch unit 141 that allows the signal switching unit 140 to switch the signal path between the second frequency conversion unit 145 and the plurality of direct-type test antennas 6b, 6c, 6d, 6e, 6f to the signal path that one test antenna from among the plurality of direct-type test antennas and the second frequency conversion unit 145. By this configuration, the number of frequency conversion units is significantly reduced as compared with the conventional test devices in which the frequency conversion units are provided for each of the plurality of test antennas 6, so that cost reduction and space saving can be realized.

Moreover, the test antenna 6 has a hybrid configuration including a reflection-type test antenna 6a that indirectly transmits and receives radio signals using the reflector 7, and a plurality of direct-type test antennas 6b, 6c, 6d, 6e, 6f that directly transmit and receive radio signals. By this configuration, it is possible to use a wider quiet zone when the reflection-type test antenna 6a, that can form a wider quite zone compared to the direct-type test antenna, is used alone, while the number of reflection-type test antennas having a complicated structure can be minimized. In addition, since the direct-type test antennas 6b, 6c, 6d, 6e, and 6f do not use a reflector, the installation space can be saved. Therefore, the test device 1 according to the present embodiment can perform far field measurement of transmission/reception properties such as RF properties and RRM properties of the DUT 100 at low cost.

(Second Embodiment)

Figure 11:
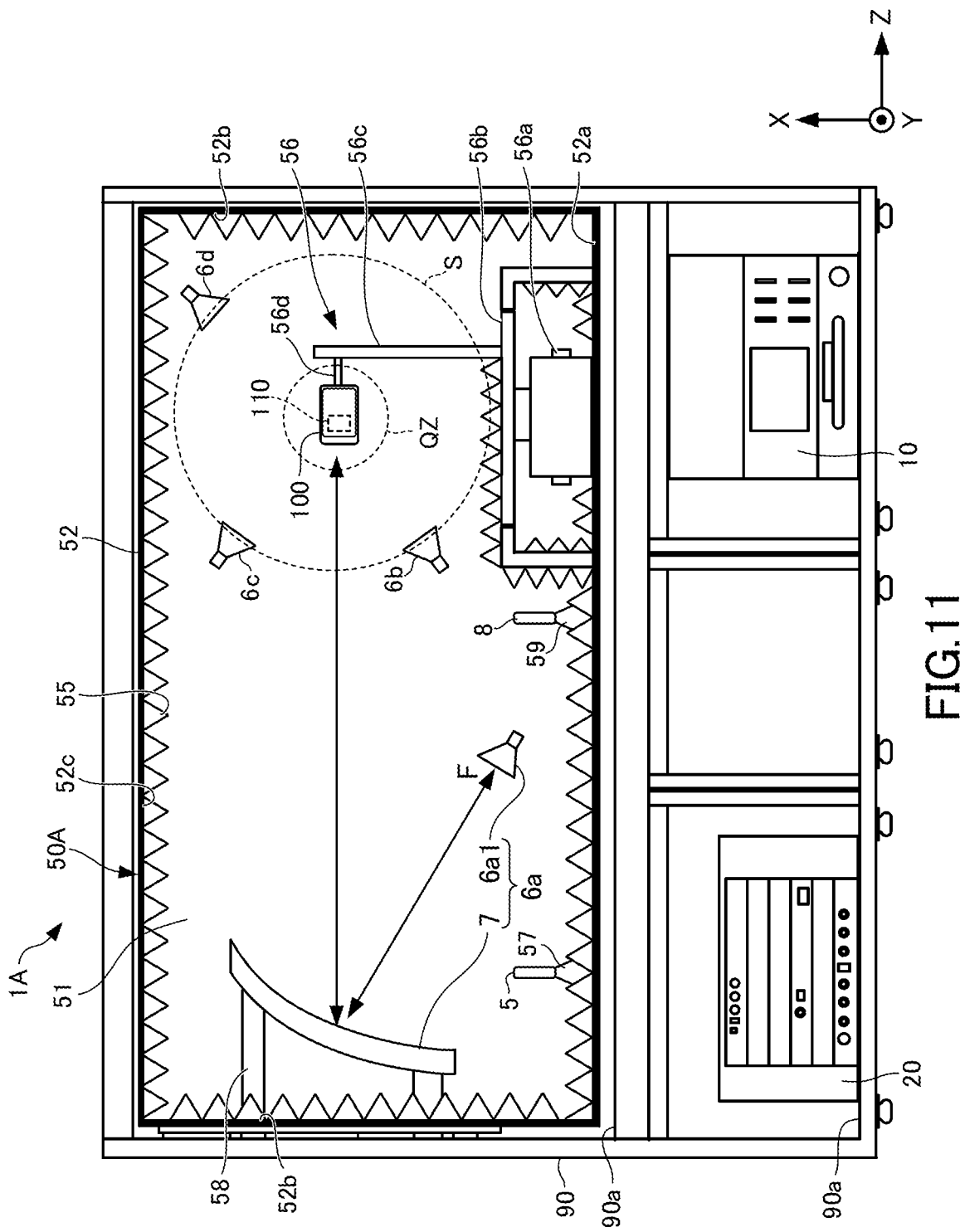
FIG. 11 is a diagram showing a schematic configuration of the entire test device according to the second embodiment of the present invention.
Figure 12:
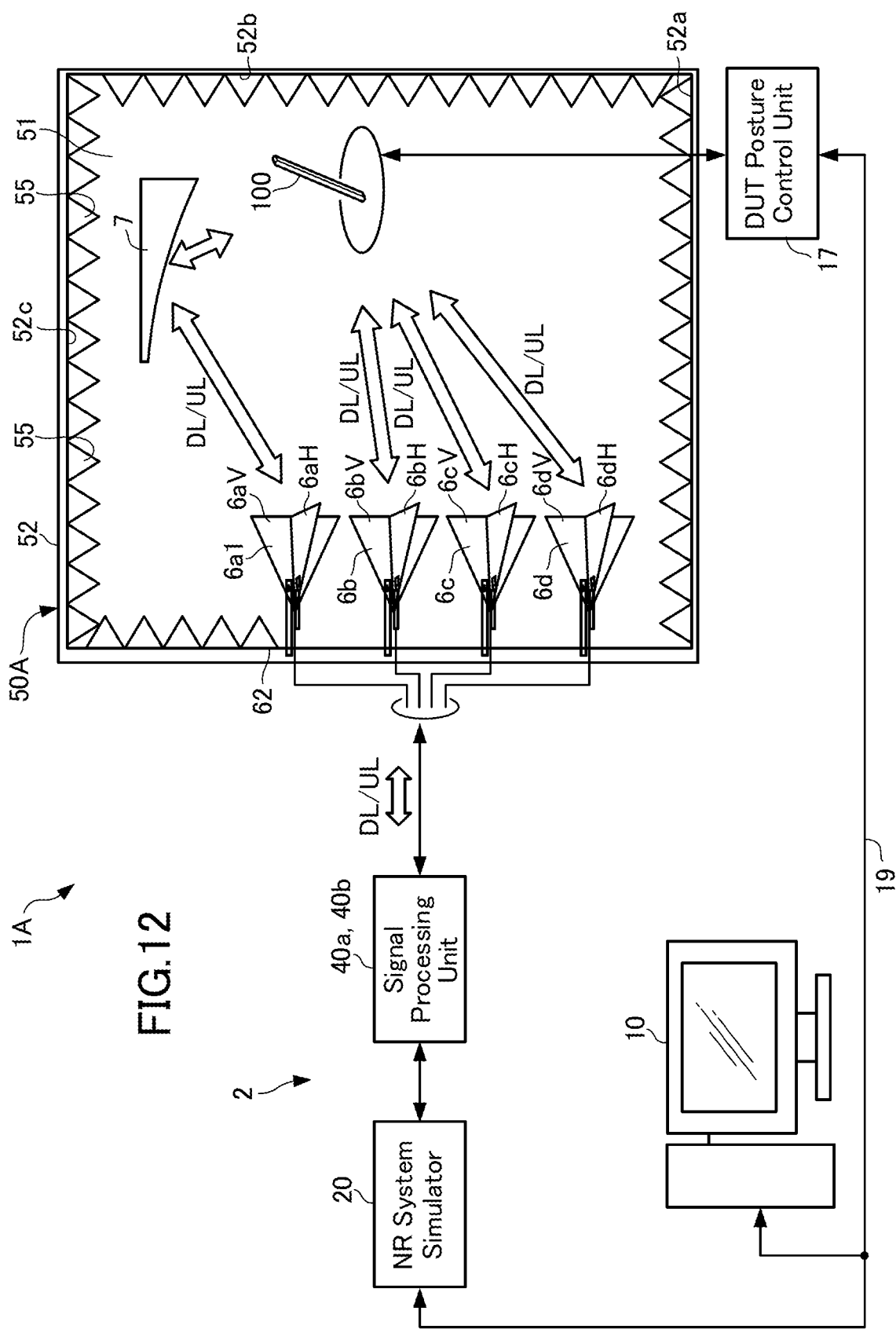
FIG. 12 is a block diagram showing a functional configuration of a test device according to the second embodiment of the present invention.

Next, the test device 1A according to the second embodiment of the present invention will be described. Six test antennas 6a, 6b, 6c, 6d, 6e, 6f are used in the first embodiment, whereas four test antennas are used in the second embodiment as shown in FIGS. 11 and 12. The difference is that 6a, 6b, 6c, and 6d (hereinafter, may be referred to as a test antenna 6A) are used. Hereinafter, the same configurations as those of the test device according to the first embodiment are designated by the same reference numerals, and detailed description thereof will be omitted as appropriate.

(Test Antennas)

First, the test antennas 6A according to the second embodiment will be described.

Figure 14:
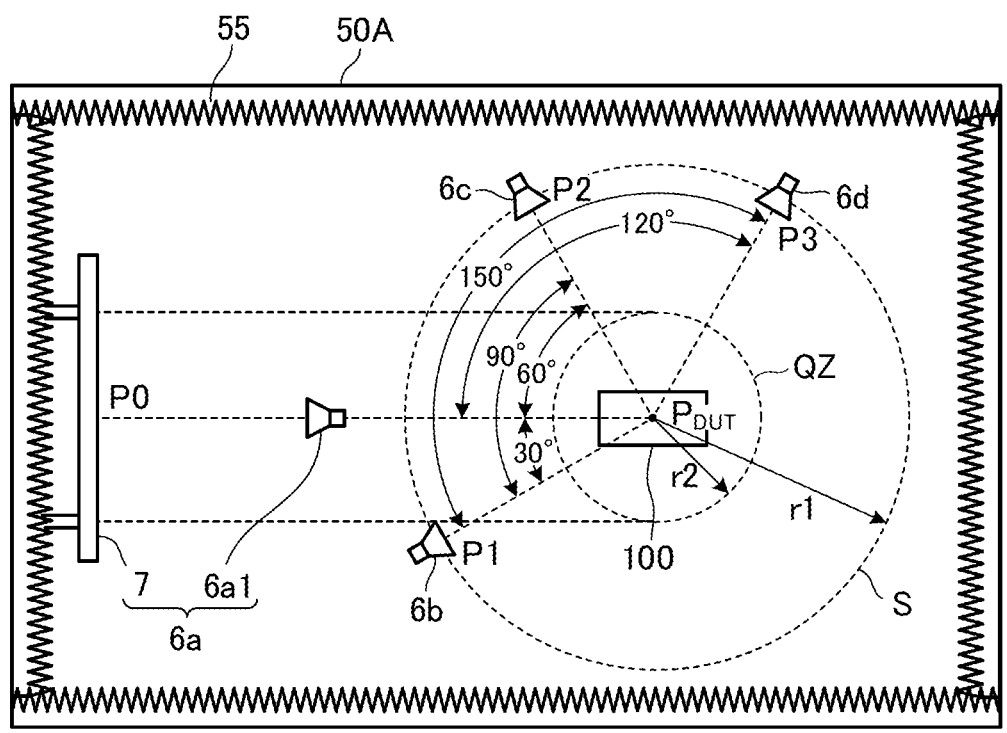
FIG. 14 is a plan view of the OTA chamber of the test device according to the second embodiment of the present invention with the top plate removed viewed from above.
Figure 14:
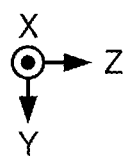
Figure 15:
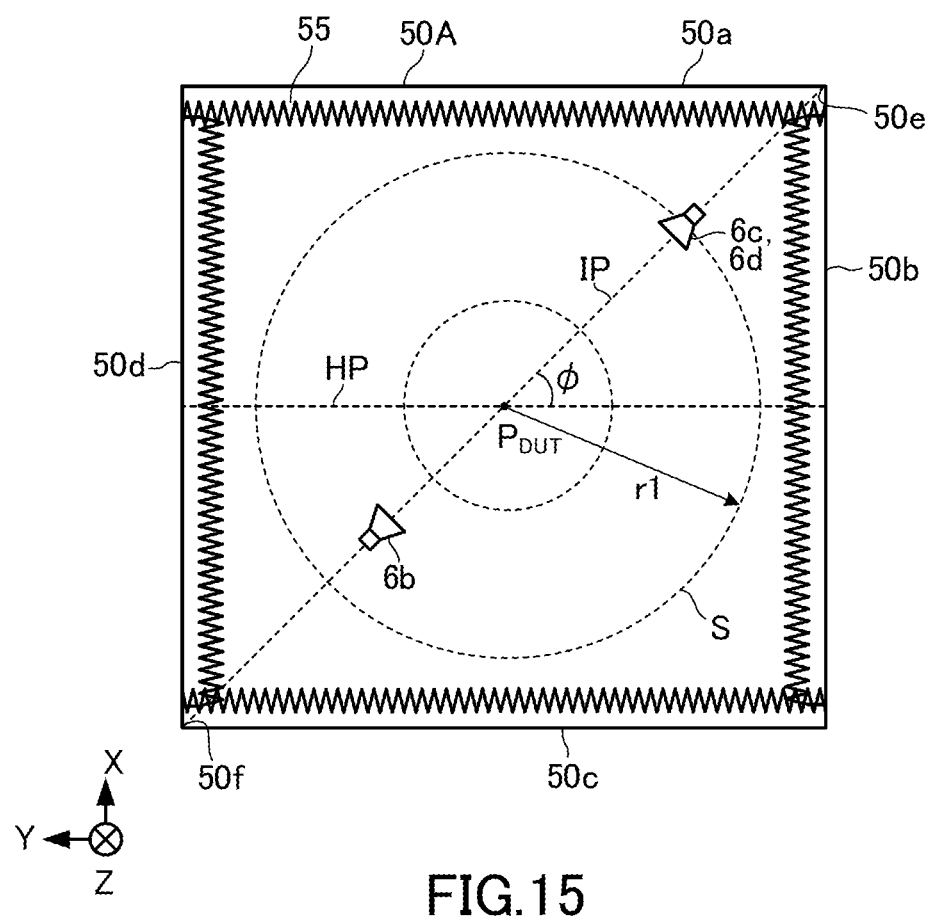
FIG. 15 is a side view of the OTA chamber of FIG. 14 with the right side plate removed viewed from the right side.
Figure 16:
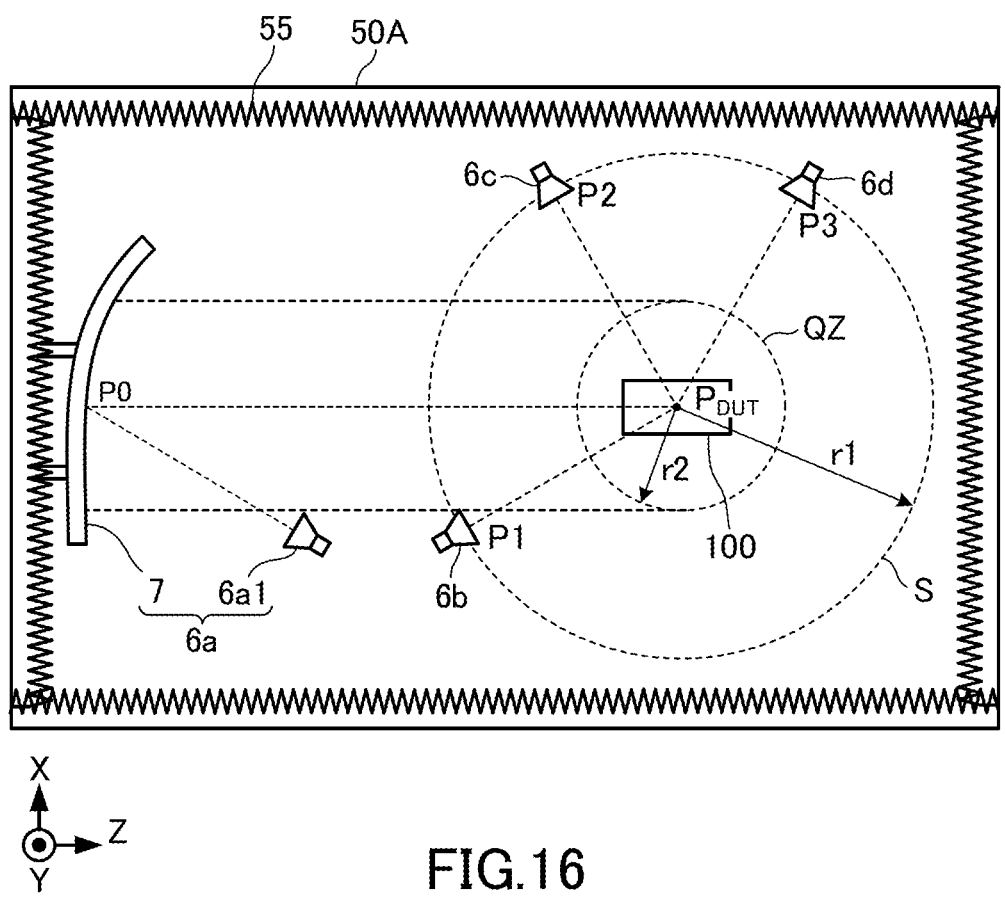
FIG. 16 is a front view of the OTA chamber of FIG. 14 with the side plate on the front side removed viewed from the front side.

FIG. 14 is a schematic plan view of the OTA chamber 50A of the test device 1A according to the present embodiment with the top plate removed viewed from above, and FIG. 15 is a schematic side view of the OTA chamber 50A with a side plate (the right side plate in FIG. 14) removed viewed from the side. FIG. 16 is a schematic front view of the OTA chamber 50A with the front side plate (lower side plate in FIG. 14) removed viewed from the front direction.

As shown in FIGS. 14, 15, and 16, the test antenna 6A includes a reflection-type test antenna 6a and three direct-type test antennas 6b, 6c, and 6d. The reflection-type test antenna 6a transmits or receives a radio signal for measuring the transmission properties or the reception properties of the DUT 100 to and from the antenna 110 through the reflector 7. The direct-type test antennas 6b, 6c, and 6d directly transmit or receive a radio signal for measuring the transmission properties or the reception properties of the DUT 100 to and from the antenna 110 included in the DUT 100. Each test antenna 6A includes a horizontally polarized antenna and a vertically polarized antenna (see FIG. 12).

(Reflection-Type Test Antenna)

The reflection-type test antenna 6a has the same configuration as that of the first embodiment.

(Direct-Type Test Antennas)

Next, the direct-type test antennas 6b, 6c, and 6d will be described.

The direct-type test antennas 6b, 6c, and 6d directly transmit and receive radio signals to and from the antenna 110 without using a reflector. The direct-type test antennas 6b, 6c and 6d have horizontally polarized antennas 6bH, 6cH and 6dH, respectively, and vertically polarized antennas 6bV, 6cV and 6dV, respectively (see FIG. 12). These direct-type test antennas 6b, 6c, and 6d are arranged on a virtual spherical surface S having a radius r1 centered on the arrangement position PDUT of the DUT 100. "The test antenna is arranged on the virtual spherical surface S" means that the centers P1, P2, and P3 of the radiation openings of the test antennas 6b, 6c, and 6d are located on the virtual spherical surface S. The test antennas 6b, 6c, and 6d do not have to be arranged at the same distance from the DUT 100, and the test antennas 6b, 6c, and 6d may have different distances from the DUT 100.

The direct-type test antennas 6b, 6c, and 6d form predetermined arrival angles θ1, θ2, θ3 (for example, 30°, 60°, 120°), which are different from each other with respect to the radio wave arrival direction (Z axis) from the reflection-type test antenna 6a at the arrangement position $P_{DUT}$ of the DUT100. Further, at least one of the direct-type test antennas 6b, 6c, 6d (for example, the test antenna 6b) forms additional arrival angles θ4 and θ5 (for example, 90° and 150°) different from the predetermined arrival angles θ1, θ2 and θ3, with respect to the radio wave arrival direction from one of other direct-type test antennas (for example, test antenna 6c, 6d) at the arrangement position $P_{DUT}$ of the DUT 100). Thus, the two direct-type test antennas form an additional arrival angle, so that it is possible to reduce the required number of test antennas.

As shown in FIG. 14, the direct-type test antennas 6b, 6c, and 6d include: a direct-type first test antenna 6b that forms an arrival angle θ (for example, 30°) of a predetermined angle (θ) in one rotation direction (the counterclockwise direction in FIG. 14) with respect to the radio wave arrival direction (Z axis) at the arrangement position $P_{DUT}$ of the DUT 100; a direct-type second test antenna 6c that forms an arrival angle 2θ (for example, 60°) of twice the predetermined angle (θ) in the other rotation direction (the clockwise direction in FIG. 14) with respect to the radio wave arrival direction (Z axis) at the arrangement position $P_{DUT}$ of the DUT 100; and a third test antenna 6d that forms an arrival angle 4θ (for example, 60°) of four times the predetermined angle (θ) in the other rotation direction (the clockwise direction in FIG. 14) with respect to the radio wave arrival direction (Z axis) at the arrangement position $P_{DUT}$ of the DUT 100.

By this configuration, the test device 1A according to the present embodiment can form a relative arrival angle of 3θ (for example, 90°) by the direct-type first test antenna 6b and the direct-type second test antenna 6c, and a relative arrival angle of 5θ (for example, 150°) can be formed by the direct-type first test antenna 6b and the direct-type third test antenna 6d. As a result, the direct-type first, second, and third test antennas 6b, 6c, and 6d, together with the reflection-type test antenna 6a, can realize relative arrival angles θ, 2θ, 3θ, 4θ, and 5θ (for example, 30°, 60°, 90°, 120°, 150°). This means that, in the present embodiment, five relative arrival angles can be obtained by a total of four test antennas. Therefore, the number of antennas can be reduced from the configuration of the first embodiment (see FIG. 8) as a comparative example in which five relative arrival angles are obtained by a total of six test antennas.

Further, the relative arrival angle that can be realized by the test device 1A according to the present embodiment is a multiple of the specific angle θ, and the RRM properties can be efficiently and accurately measured within a predetermined angle range without leakage.

Specifically, in the test device 1A according to the present embodiment, the specific angle θ is 30°. Therefore, the relative arrival angles that can be realized in the test device 1A according to the embodiment are 30°, 60°, 90°, 120° and 150°. By this configuration, the RRM properties specified in Standard 3GPP TR 38.810 V16.2.0 (2019-03) can be measured. Further, since the specific angle θ is 30°, with respect to the radio wave arrival direction (Z-axis) from the reflection-type test antenna 6a, the first test antenna 6b forms an arrival angle of 30°, the second test antenna 6c forms an arrival angle of 60°, the third test antenna 6d forms an arrival angle of 120°, and there is no test antenna forming an arrival angle of 90°. As a result, the internal space 51 of the OTA chamber 50A can be reduced while maintaining the distance between the test antenna and the antenna under test (or DUT) required to realize the far field measurement.

As shown in FIG. 15, the direct-type test antennas 6b, 6c, and 6d are arranged on a (virtual) plane IP that passes through the arrangement position $P_{DUT}$ of the DUT 100 and is inclined by an angle φ with respect to the horizontal plane HP. By this configuration, even in the small OTA chamber 50A of the internal space 51, the distance between the test antenna and the antenna under test (or DUT) required for the far field measurement can be secured. Further, since the direct-type test antennas 6b, 6c, and 6d are arranged on the same plane passing through the arrangement position $P_{DUT}$ of the DUT 100, the positioning work at the time of installation is easy.

Further, as shown in FIGS. 14 to 16, the OTA chamber 50A has a substantially rectangular parallelepiped or substantially cubic shape, and the inclined plane IP is the boundary 50e or the side plate 50d between the side plate 50b and the top plate 50a of the OTA chamber 50A and the boundary 50f of the bottom plate 50c substantially intersect (see FIG. 15). By this configuration, the internal space 51 of the OTA chamber 50A can be minimized while maintaining the distance between the test antenna and the antenna under test (or DUT) required to realize far field measurement.

As can be seen from FIGS. 14 to 16, the radio wave arrival direction (Z-axis) from the reflection-type test antenna 6a at the arrangement position PDUT of the DUT 100 exists on an inclined plane IP. This means that the straight line connecting the opening center P0 of the reflector 7 of the reflection-type test antenna 6a and the arrangement position $P_{DUT}$ of the DUT 100 exists on the inclined plane IP.

The direct-type test antennas 6b, 6c, 6d are arranged at least $2D^2/\lambda$ away from the antenna 110 of the DUT100. Here, D is the antenna size of the antenna 110, and λ is the wavelength of the radio wave transmitted from the direct-type test antennas 6b, 6c, and 6d. By this configuration, space saving is realized, and the far field measurement of the DUT 100 can be performed in the limited space in the OTA chamber 50A.

The direct-type test antennas 6b, 6c, and 6d are arranged outside the path of the radio wave beam passing through the quiet zone QZ by reflecting the reflector 7 of the reflection-type test antenna 6a (see FIG. 16). By this configuration, a favorable quiet zone QZ can be formed.

(Comparison with the First Embodiment)

Figure 17:
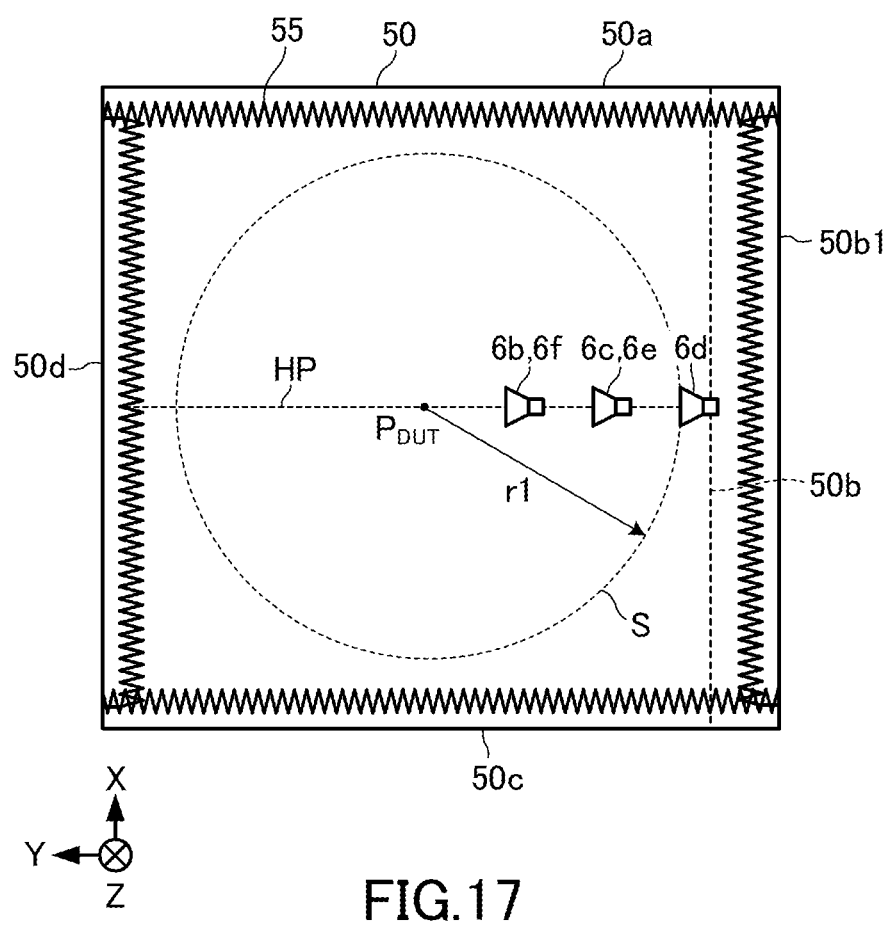
FIG. 17 is a side view of the OTA chamber of FIG. 8 with the right side plate removed viewed from the right side.

Here, the configuration of the test antenna 6 of the first embodiment will be described again as a comparative example with reference to FIGS. 8 and 17. FIG. 8 is a plan view of the OTA chamber 50 of the test device 1 according to the first embodiment with the top plate removed and viewed from above. FIG. 17 is a side view of the OTA chamber 50 with a side plate (the side plate on the right side of FIG. 8) removed viewed from the side.

The first embodiment differs from the second embodiment in the point that the five direct test antennas 6b, 6c, 6d, 6e, 6f are arranged on the horizontal surface HP in the first embodiment, while the three direct-type test antennas 6b, 6c, 6d, are arranged on the plane IP inclined with respect to the horizontal plane HP in the second embodiment. Here, it is assumed that the direct-type test antennas 6b, 6c, 6d, 6e, and 6f of the first embodiment are arranged on a virtual spherical surface S having a radius r1 centered on the arrangement position $P_{DUT}$ of the DUT 100. The direct-type test antennas 6b, 6c, 6d, 6e, 6f do not have to be arranged at the same distance from the DUT100, and the direct-type test antennas 6b, 6c, 6d, 6e, 6f may take different distances from the DUT100.

As shown in FIG. 8, the direct-type test antenna 6b of the first embodiment forms an arrival angle of 30° with respect to the radio wave arrival direction (Z axis) from the reflection-type test antenna 6a at the arrangement position $P_{DUT}$ of the DUT 100. Similarly, the direct test antennas 6c, 6d, 6e, and 6f form the arrival angles of 60°, 90°, 120°, and 150°, respectively.

As shown in FIG. 17, in the first embodiment, particularly the space for arranging the direct-type test antenna 6d forming an arrival angle of 90° is narrow, and the side plate 50b1 of the OTA chamber 50 is arranged outside the position of the side plate 50b of the second embodiment shown by a broken line, so that the space in the OTA chamber 50 is expanded. This means that the OTA chamber 50A of the test device 1 according to the second embodiment can be made more compact than that of the first embodiment.

Further, the relative arrival angles of 30°, 60°, 90°, 120°, and 150° formed by the two test antennas can be obtained by one reflection-type test antenna and five direct-type test antennas in the first embodiment, while the same relative arrival angles are realized by one reflection-type test antenna and three direct-type test antennas in the second embodiment. Therefore, in the second embodiment, the same RRM test can be performed with a smaller number of test antennas as compared with the first embodiment.

Further, in the second embodiment, the quiet zone formed by the direct-type test antennas 6b, 6c, 6d is the same as the quiet zone QZ formed by the reflection-type test antenna 6a, but is not limited to this. The quiet zone formed by the direct-type test antennas 6b, 6c, and 6d may be different from the quiet zone QZ firmed by the reflection-type test antenna 6a. For example, if the quiet zone QZ formed by the reflection-type test antenna 6a is made wider, a wide quiet zone can be used when the reflection-type test antenna 6a is used alone to measure RF properties and the like.

(NR System Simulator)

The NR system simulator 20 has the same configuration as that of the first embodiment.

(Signal Processing Unit)

Next, the signal processing unit 40 will be described.

Figure 13:
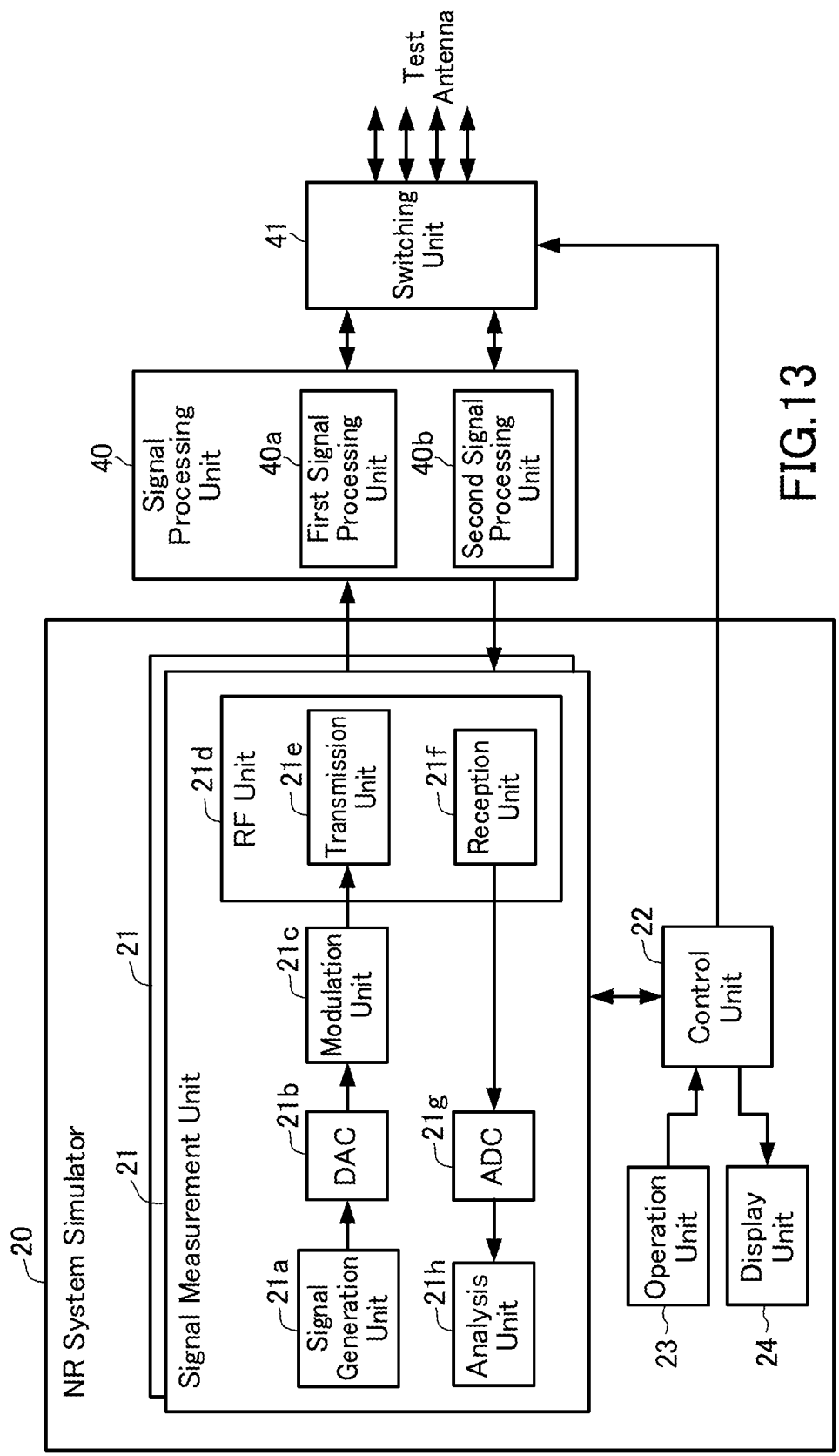
FIG. 13 is a block diagram showing a functional configuration of an NR system simulator in the test device according to the second embodiment of the present invention.

As shown in FIG. 13, the signal processing unit 40 is provided between the NR system simulator 20 and the switching unit 41, and includes a first signal processing unit 40a and a second signal processing unit 40b. The first signal processing unit 40a performs signal processing such as frequency conversion of signals transmitted and received to and from one test antenna to be used, and the second signal processing unit 40b performs signal processing such as frequency conversion of signals transmitted and received to and from the other test antenna to be used.

To be specific, the first signal processing unit 40a includes an up-converter, a down-converter, an amplifier, a frequency filter, and the like, performs the signal processing of frequency conversion (up-conversion), amplification, frequency selection and the like with respect to the test signal to be transmitted to the one test antenna to be used, and outputs the processed signal to the switching unit 41. Further, the first signal processing unit 40a performs the signal processing of frequency conversion (down-conversion), amplification, frequency selection and the like with respect to the signal to be measured to be inputted through the switching unit 41 from the one test antenna to be used, and outputs the processed signal to the signal measurement unit 21.

Similarly, the second signal processing unit 40b includes an up-converter, a down-converter, an amplifier, a frequency filter, and the like, performs the signal processing of frequency conversion (up-conversion), amplification, frequency selection and the like with respect to the test signal to be transmitted to the other test antenna to be used, and outputs the processed signal to the switching unit 41. Further, the second signal processing unit 40b performs the signal processing of frequency conversion (down-conversion), amplification, frequency selection and the like with respect to the signal to be measured to be inputted through the switching unit 41 from the other test antenna to be used, and outputs the processed signal to the signal measurement unit 21.

The switching unit 41 is provided between the signal processing unit 40 and the test antennas 6A, and switches the signal path under the control of the control unit 22, so that the first signal processing unit 40a and the one test antenna to be used are connected and/or the second signal processing unit 40b and another test antenna to be used are connected. The switching unit 41 may be included in the signal processing unit 40.

For example, at the time of transmission, the first signal processing unit 40a performs signal processing on the test signal transmitted to the one test antenna to be used and outputs the processed signal to the switching unit 41. The second signal processing unit 40b performs signal processing on the test signal transmitted to the other test antenna to be used and outputs the processed signal to the switching unit 41. The switching unit 41, under the control of the control unit 22, switches the signal path so that the first signal processing unit 40a and one test antenna to be used are connected and the second signal processing unit 40b and the other test antenna to be used are connected. Therefore, the test signal outputted from the first signal processing unit 40a is transmitted to the one test antenna to be used through the switching unit 41, and is outputted from the test antenna toward the DUT 100. Further, the test signal outputted from the second signal processing unit 40b is transmitted to the other test antenna to be used through the switching unit 41, and is outputted from the test antenna toward the DUT 100.

It should be noted that the signal measurement unit 21 of the NR system simulator 20 may be provided with two sets so as to correspond to the two test antennas to be used. Further, the switching unit 41 may have a switching configuration similar to the switching configuration of the signal switching unit 140 of the first embodiment. The switching unit 41 may have a configuration in which the switching configuration of the signal switching unit 140 is changed according to the number of test antennas. Further, the first signal processing unit 40a and the second signal processing unit 40b may have the same configuration as the first frequency conversion unit 144 and the second frequency conversion unit 145 of the first embodiment.

(Test Method)

Next, a test method performed using the test device 1A according to the second embodiment will be described. The test method according to the second embodiment is substantially the same as the test method according to the first embodiment described with reference to FIG. 10. Hereinafter, the difference between the test method according to the second embodiment and the first embodiment will be described with reference to FIG. 10, taking a test performed using two test antennas (for example, measurement of transmission/reception properties such as RRM properties) as an example.

Figure 10:
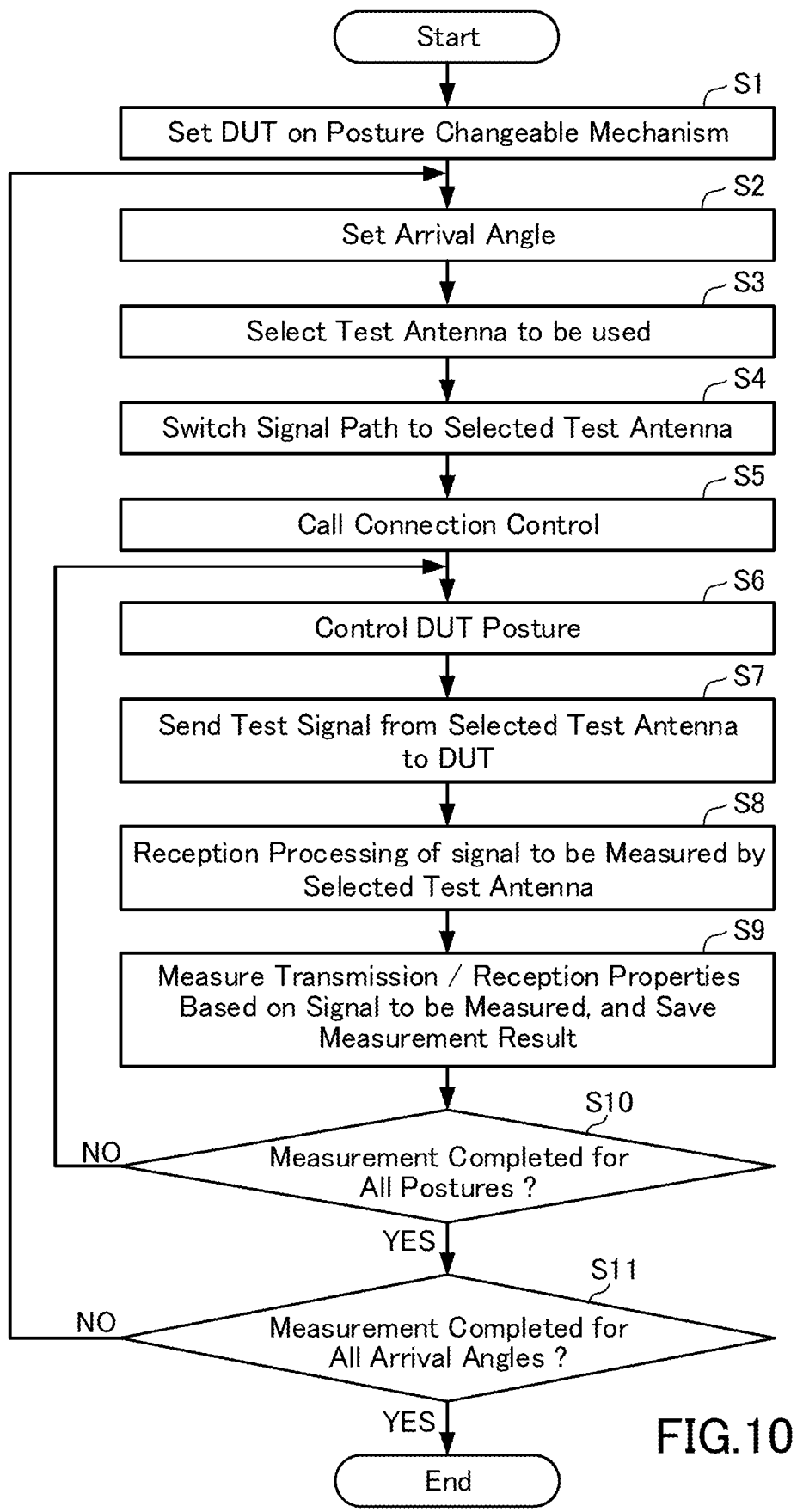
FIG. 10 is a flowchart showing an outline of a test method performed by using the test device according to the first embodiment of the present invention.

In the second embodiment, in Step S3 (antenna selection) of FIG. 10, the control unit 11 selects two test antennas 6A that realize the arrival angle from the arrival angle set in Step S2. For example, when the set arrival angle is 30°, the test antenna 6a and the test antenna 6b are selected, when the set arrival angle is 60°, the test antenna 6a and the test antenna 6c are selected, when the set arrival angle is 90°, the test antenna 6a and the test antenna 6c are selected, when the set arrival angle is 120°, the test antenna 6a and the test antenna 6d are selected, and when the arrival angle is 150°, the test antenna. 6b and the test antenna 6d are selected.

Further, in Step S7 (transmission processing) of FIG. 10, the signal processing unit 40 performs signal processing such as frequency conversion (up-conversion), amplification, and frequency selection on the test signal, and transmits the processed test signal to the selected test antennas 6A, and the test antennas 6A output the signal toward the DUT 100. The signal processing unit 40 has the first and the second signal processing units 40a and 40b in order to process the test signals transmitted to the two test antennas 6A selected by the control unit 11 in parallel. In order to switch the connection between the test antennas 6a, 6b, 6c, 6d and the first and second signal processing units 40a, 40b, a switching unit 41, which is a switching mechanism, is provided.

Similarly, in Step S8 (reception processing) of FIG. 10, the signal processing unit 40 having the first and the second signal processing units 40a and 40b can perform the signal processing of the two signals to be measured sent from the two test antennas 6A selected by the control unit 11 and switched by the switching unit 41, in parallel.

Next, the action and effect of the second embodiment will be described.

In the test device 1A according to the second embodiment, the direct-type test antennas 6b, 6c, and 6d are predetermined to be different from each other with respect to the radio wave arrival direction from the reflection-type test antenna 6a at the arrangement position $P_{DUT}$ of the DUT100. At least one of the plurality of direct-type test antennas 6b, 6c, 6d forming the arrival angles (30°, 60°, 120°) of the DUT100 is used for the direct-type test at the arrangement position $P_{DUT}$ of the DUT100. Additional arrival angles (90°, 150°) different from the predetermined arrival angle are formed with respect to the arrival direction of radio waves from any of the other test antennas of the antenna.

Specifically, the direct-type test antenna 6b and the direct-type test antenna 6c form an additional arrival angle of 90°, and the direct-type test antenna 6b and the direct-type test antenna 6d form an additional arrival angle of 150°. By this configuration, the number of required test antennas can be reduced, thereby realizing cost reduction and space saving.

Further, the test antennas 6A have a hybrid configuration including a reflection-type test antenna 6a that indirectly transmits and receives a radio signal using a reflector 7, and a plurality of direct-type test antennas 6b, 6c, and 6d that directly transmit and receive a radio signal. This minimizes the number of reflection-type test antennas with complex structures, while making it possible to use a wider quite zone when the reflection-type test antenna, capable of forming a quiet zone comparatively wider than that of the direct-type test antenna, is used alone. Further, the installation space can be saved, since the direct-type test antennas 6b, 6c, 6d do not use a reflector. Furthermore, since the direct-type test antennas 6b, 6c, and 6d are arranged on the same plane IP inclined with respect to the horizontal plane HP, the OTA chamber 50A capable of measuring the far field can be miniaturized, and positioning work at the time of installation is easy. Therefore, the test device 1A according to the present embodiment can perform far field measurement of transmission/reception properties such as RE properties and RRM properties of the DUT 100 at low cost with a small number of antennas.

The present invention can be applied not only to an anechoic box but also to an anechoic chambers. Further, in the present invention, the first embodiment and the second embodiment may be arbitrarily combined. For example, the measuring device 2 of the first embodiment and the test antenna 6A of the second embodiment may be combined.

As described above, the present invention has an effect that far field measurement of transmission/reception properties such as RF properties and RRM properties of the test object can be performed at low cost, and is a test device and test for a wireless terminal. Useful for all methods.

EXPLANATION OF REFERENCE NUMERALS 1, 1A Test Device
2 Measurement Device
5, 8 Link Antenna
6 Test Antenna
6a Reflection-Type Test Antenna
6a1 Primary Radiator
6b Direct-Type First Test Antenna
6c Direct-Type Second Test Antenna
6d Direct-Type Third Test Antenna
6e Direct-Type Fourth Test Antenna
6f Direct-Type Fifth Test Antenna
7 Reflector
7A Reflection Mirror
10 Integrated Control Device
11 Control Unit
11a CPU
11b ROM
11c RAM
11d External Interface Unit
12 Operation Unit
13 Display Unit
14 Call Connection Control Unit
15 Signal Transmission/Reception Control Unit
17 DUT Posture Control Unit
17a DUT Posture Control Table
17b Arrival Angle-Test Antenna Correspondence Table
19 Network
20 NR System Simulator
21 Signal Measurement Unit
21a Signal Generation Unit
21b DAC
21c Modulation Unit
21d RF Unit
21e Transmission Unit
21f Reception Unit
21g ADC
21h Analysis Unit
22 Control Unit
23 Operation Unit
24 Display Unit
40 Signal Processing Unit
40a First Signal Processing Unit
40b Second Signal Processing Unit
41 Switching Part
50, 50A OTA Chamber (Anechoic Box)
51 Internal Space
52 Housing Body
52a Bottom Surface
52b Side Surface
52c Top Surface
55 Radio Wave Absorber
56 Posture Changeable Mechanism
56a Drive Unit
56b Turntable
56c Prop
56d DUT Mounting Unit
57,59 Holder
58 Reflector Holder
90 Rack Structure
90a Each Rack
100 DUT (Test Object)
100A Wireless Terminal
110 Antenna (Antenna Under Test)
140 Signal Switching Unit
141 Switch Unit (Switching Unit)
142 First Switching Unit
143 Second Switching Unit
144 First Frequency Converter
145 Second Frequency Converter
146 First Transmission Converter
147 First Reception Converter
148 Second Transmission Converter
149 Second Reception Converter
150 First Up-Converter
151 Second Up-Converter 152 Third Up-Converter
153 Fourth Up-Converter
154 First Down-Converter
155 Second Down-Converter
156 Third Down-Converter
157 Fourth Down-Converter
F Focus Position of Reflector
QZ Quiet Zone
S Virtual Sphere
HP Horizontal Plane
IP Inclined Plane

What is claimed is:

1. A test device to measure transmission properties or reception properties of a test object having an antenna under test, the test device comprising:
   an anechoic box having an internal space that is not affected by a radio environment;
   a plurality of test antennas, accommodated in the internal space, to transmit or receive a radio signal to or from the antenna under test;
   a posture changeable mechanism to change a posture of the test object arranged in a quiet zone (QZ) in the internal space;
   a measurement device to measure the transmission properties or the reception properties of the test object, using the test antenna with respect to the test object whose posture is changed by the posture changeable mechanism; and
   a reflector on which the radio signal is reflected, wherein
   the plurality of test antennas include a reflection-type test antenna that transmits or receives the radio signal to or from the antenna under test through the reflector, and a plurality of direct-type test antennas that directly transmits or receives the radio signal to or from the antenna under test,
   the plurality of direct-type test antennas are arranged on the same plane passing through an arrangement position ($P_{DUT}$) of the test object, and form predetermined arrival angles differing from each other with respect to a radio wave arrival direction from the reflection-type test antenna at the arrangement position of the test object, and at least one of the plurality of direct-type test antennas form an additional arrival angle different from the predetermined arrival angles with respect to a radio wave arrival direction from either one of other the direct-type test antennas at the arrangement position of the test object, and
   the plurality of direct-type test antennas are arranged at least $2D^2/\lambda$ away from the antenna under test where D is an antenna size of the test under test, $\lambda$ is the wavelength of the radio wave transmitted from the plurality of direct-type test antennas.

2. The test device according to claim 1, wherein the plurality of direct-type test antennas are arranged on a plane (IP) inclined with respect to a horizontal plane.

3. The test device according to claim 2, wherein the anechoic box has a shape of a substantially rectangular parallelepiped or a substantially cube, and the inclined plane intersects with a boundary between one side plate and a top plate or a boundary between the one side plate and a bottom plate of the anechoic box.

4. The test device according to claim 2, wherein the plurality of direct-type test antennas include:
   a direct-type first test antenna that forms an arrival angle of a predetermined angle ($\theta$) in one rotation direction with respect to the radio wave arrival direction from the reflection-type test antenna at the arrangement position of the test object;
   a direct-type second test antenna that forms an arrival angle of two times the predetermined angle ($\theta$) in other rotation direction opposite to the one rotation direction with respect to the radio wave arrival direction at the arrangement position of the test object; and
   a direct-type third test antenna that forms an arrival angle of four times the predetermined angle ($\theta$) in the other rotation direction with respect to the radio wave arrival direction at the arrangement position of the test object.

5. The test device according to claim 1, wherein the predetermined arrival angle and the additional arrival angle are multiples of a specific angle.

6. The test device according to claim 1, wherein the predetermined arrival angle and the additional arrival angle include 30°, 60°, 90°, 120°, and 150°.

7. The test device according to claim 1, wherein the plurality of direct-type test antennas are arranged outside a path of the radio wave beam passing through the quiet zone by reflecting the reflector of the reflection-type test antenna.

8. A test device to measure transmission properties or reception properties of a test object having an antenna under test, the test device comprising:
   an anechoic box having an internal space that is not affected by a radio environment;
   a plurality of test antennas, accommodated in the internal space, to transmit or receive a radio signal to or from the antenna under test;
   a posture changeable mechanism to change a posture of the test object arranged in a quiet zone (QZ) in the internal space;
   a measurement device to measure the transmission properties or the reception properties of the test object, using the test antenna with respect to the test object whose posture is changed by the posture changeable mechanism; and
   a reflector on which the radio signal is reflected, wherein
   the plurality of test antennas include a reflection-type test antenna that transmits or receives the radio signal to or from the antenna under test through the reflector, and a plurality of direct-type test antennas that directly transmits or receives the radio signal to or from the antenna under test,
   the measurement device includes:
   a signal processing unit that converts a frequency of a signal transmitted as a radio wave by the plurality of the test antenna or a frequency of a radio signal received by the plurality of test antennas; and
   a switching unit that switches a signal path between the signal processing unit and the plurality of direct-type test antenna to a signal path that one test antenna of the plurality of direct-type test antennas and the signal processing unit are connected, and
   the plurality of direct-type test antennas are arranged at least $2D^2/\lambda$ away from the antenna under test where D is an antenna size of the test under test, $\lambda$ is the wavelength of the radio wave transmitted from the plurality of direct-type test antennas.

9. The test device according to claim 8, wherein the signal processing unit includes:
   a first frequency conversion unit that converts a frequency of a signal to be transmitted as a radio signal by the reflection-type test antenna or a frequency of a radio signal received by the reflection-type test antenna; and a second frequency conversion unit that converts a frequency of a signal to be transmitted as a radio signal by the direct-type one test antenna switched by the switching unit or a frequency of a radio signal received by the direct-type one test antenna.

10. The test device according to claim 9, wherein
the first frequency conversion unit includes a first transmission converter that up-converts a signal to be transmitted as a radio signal from the reflection-type test antenna, and a first reception converter that down-converts a radio signal received by the reflection-type test antenna,
the second frequency conversion unit includes a second transmission converter that up-converts a signal to be transmitted as a radio signal from the plurality of the direct-type test antennas and a second reception converter that down-converts a radio signal received by the plurality of the direct-type test antennas,
the first transmission converter includes a first up-converter that up-converts a signal to be transmitted as a horizontally polarized radio signal from the reflection-type test antenna and a second up-converter that up-converts a signal to be transmitted as a vertically polarized radio signal from the reflection-type test antenna,
the first reception converter includes a first down converter that down-converts a horizontally polarized radio signal received by the reflection-type test antenna and a second down-converter that down-converts a vertically polarized radio wave received from the reflection-type test antenna,
the second transmission converter includes a third up-converter that up-converts a signal to be transmitted as a horizontally polarized radio signal from the plurality of the direct-type test antennas and a fourth up-converter that up-converts a signal to be transmitted as a vertically polarized radio signal from the plurality of the direct-type test antennas,
the second reception converter includes a third down-converter that down-converts a horizontally polarized radio signal received by the plurality of direct-type test antennas and a fourth down-converter that down-converts a vertically polarized radio signal received by the plurality of direct-type test antennas.

11. The test device according to claim 8, wherein
the plurality of direct-type test antennas form mutually different arrival angles with respect to an arrival direction of a radio wave from the reflection-type test antenna at the arrangement position ($P_{DUT}$) of the test object.

12. The test device according to claim 8, wherein
the plurality of direct-type test antennas are arranged outside a path of the radio wave beam passing through the quiet zone by reflecting the reflector of the reflection-type test antenna.

13. A test method to use a test device to measure transmission properties or reception properties of a test object having an antenna under test, the test device comprising:
an anechoic box having an internal space that is not affected by a radio environment;
a plurality of test antennas, accommodated in the internal space, to transmit or receive a radio signal to or from the antenna under test;
a posture changeable mechanism to change a posture of the test object arranged in a quiet zone (QZ) in the internal space; and
a measurement device to measure the transmission properties or the reception properties of the test object, using the test antenna with respect to the test object whose posture is changed by the posture changeable mechanism, wherein
the plurality of test antennas include a reflection-type test antenna that transmits or receives the radio signal to or from the antenna under test through a reflector, and a plurality of direct-type test antennas that directly transmits or receives the radio signal to or from the antenna under test,
the plurality of direct-type test antennas are arranged on the same plane passing through an arrangement position ($P_{DUT}$) of the test object, and form predetermined arrival angles differing from each other with respect to a radio wave arrival direction from the reflection-type test antenna at the arrangement position of the test object, and at least one of the plurality of direct-type test antennas form an additional arrival angle different from the predetermined arrival angles with respect to a radio wave arrival direction from either one of other the direct-type test antennas at the arrangement position of the test object, and
the plurality of direct-type test antennas are arranged at least $2D^2/\lambda$ away from the antenna under test, where D is an antenna size of the test under test, $\lambda$ is the wavelength of the radio wave transmitted from the plurality of direct-type test antennas, the test method including
a step to change the posture of the test object arranged in the quite zone by the posture changeable mechanism,
a step to select a test antenna to be used from among the plurality of test antennas, and
a measurement step to measure the transmission properties or the reception properties of the test object by using the selected test antennas by the measurement device with respect to the test object whose posture has been changed by the posture changeable mechanism.

* * * * *